(12) United States Patent
Hatani et al.

(10) Patent No.: US 11,513,163 B2
(45) Date of Patent: Nov. 29, 2022

(54) VOLTAGE DETECTION CIRCUIT FOR VOLTAGE MEASUREMENT APPARATUS FOR USE IN ASSEMBLED BATTERY SYSTEM

(71) Applicants: PANASONIC SEMICONDUCTOR SOLUTIONS CO., LTD., Kyoto (JP); NUVOTON TECHNOLOGY SINGAPORE PTE. LTD., Singapore (SG)

(72) Inventors: Naohisa Hatani, Kyoto (JP); Gorou Mori, Osaka (JP)

(73) Assignees: NUVOTON TECHNOLOGY CORPORATION JAPAN, Kyoto (JP); NUVUTON TECHNOLOGY SINGAPORE PTE. LTD., Singapore (SG)

( * ) Notice: Subject to any disclaimer, the term of this patent is extended or adjusted under 35 U.S.C. 154(b) by 378 days.

(21) Appl. No.: 16/643,452

(22) PCT Filed: Aug. 28, 2018

(86) PCT No.: PCT/JP2018/031829
§ 371 (c)(1),
(2) Date: Feb. 28, 2020

(87) PCT Pub. No.: WO2019/044854
PCT Pub. Date: Mar. 7, 2019

(65) Prior Publication Data
US 2021/0156927 A1 May 27, 2021

(30) Foreign Application Priority Data
Aug. 29, 2017 (JP) .............................. JP2017-164276

(51) Int. Cl.
*G01R 31/396* (2019.01)
*G01R 31/3835* (2019.01)
*H01M 10/48* (2006.01)

(52) U.S. Cl.
CPC ....... *G01R 31/396* (2019.01); *G01R 31/3835* (2019.01); *H01M 10/482* (2013.01)

(58) Field of Classification Search
CPC ............. G01R 31/396; G01R 31/3835; H01M 10/482; H01M 50/569; H01M 10/48; Y02E 60/10; H02J 7/0047
See application file for complete search history.

(56) References Cited

U.S. PATENT DOCUMENTS

| 2011/0050236 A1 | 3/2011 | Sekizaki et al. |
| 2013/0043861 A1 | 2/2013 | Ishikawa |
| 2013/0187610 A1* | 7/2013 | Hayashi ................ H02J 7/0047 320/118 |

FOREIGN PATENT DOCUMENTS

| JP | 2008-235032 A | 10/2008 |
| JP | 2011-078200 A | 4/2011 |

(Continued)

OTHER PUBLICATIONS

Extended European Search Report issued in European Patent Application No. 18852385.6, dated Jul. 20, 2020.

(Continued)

*Primary Examiner* — Daniel R Miller
(74) *Attorney, Agent, or Firm* — McDermott Will & Emery LLP

(57) ABSTRACT

A voltage detection circuit is provided for measuring each cell voltage of an assembled battery configured by connecting a plurality of cells in series. The voltage detection circuit is defined as a first voltage detection circuit. The voltage detection circuit includes a downstream communication circuit that communicates with a host apparatus to communicate with a plurality of voltage detection circuits connected in series with each other; a reply signal generation circuit that generates a reply signal containing data detected by the first voltage detection circuit; an upstream transfer circuit that transfers a signal received by the upstream communication circuit to downstream; a dummy current consumption circuit that consumes a predetermined dummy current; and a control circuit that controls the reply signal generation circuit, the upstream transfer circuit, and the dummy current consumption circuit to selectively operate any one of them.

15 Claims, 16 Drawing Sheets

(56) References Cited

FOREIGN PATENT DOCUMENTS

| | | | | |
|---|---|---|---|---|
| JP | 2011078200 | A | * | 4/2011 |
| JP | 5503924 | B2 | | 5/2014 |
| JP | 2014215136 | A | * | 11/2014 |
| WO | 2009/106952 | A1 | | 9/2009 |

OTHER PUBLICATIONS

English translation of the International Preliminary Report on Patentability issued in International Application No. PCT/JP2018/031829, dated Mar. 3, 2020.
Office Action dated Jan. 4, 2022 issued in the corresponding European Patent Application No. 18852385.6.
International Search Report issued in International Patent Application No. PCT/JP2018/031829, dated Sep. 25, 2018; with English translation.

* cited by examiner

VOLTAGE DETECTION CIRCUIT FOR VOLTAGE MEASUREMENT APPARATUS FOR USE IN ASSEMBLED BATTERY SYSTEM

CROSS-REFERENCE OF RELATED APPLICATIONS

This application is the U.S. National Phase under 35 U.S.C. § 371 of International Patent Application No. PCT/JP2018/031829, filed on Aug. 28, 2018, which in turn claims the benefit of Japanese Application No. 2017-164276, filed on Aug. 29, 2017, the entire disclosures of which Applications are incorporated by reference herein.

TECHNICAL FIELD

The present invention relates to a voltage detection circuit, a voltage measurement apparatus, and an assembled battery system.

BACKGROUND ART

FIG. 1A is a block diagram of a voltage measurement apparatus showing data acquisition from a voltage detection circuit 101 in a voltage measurement apparatus of a conventional example. FIG. 1B is a block diagram of the voltage measurement apparatus showing data acquisition from a voltage detection circuit 103 in the voltage measurement apparatus of the conventional example. Referring to FIGS. 1A and 1B, the voltage measurement apparatus of the conventional example is configured to include a host apparatus 100 made up of a micro control unit (MCU) and a communication circuit, and voltage detection circuits 101, 102 and 103. In this case, each of B1, B2 and B3 is a battery cell (hereinafter, referred to as cell). For example, a plurality of batteries is connected in series, and BA is an assembled battery configured by connecting the cells B1, B2 and B3 in series.

In the conventional example, as shown in FIG. 1A, the MCU transmits a data readout command to one of the three voltage detection circuits 101, 102 and 103 connected in a daisy chain. The command is delivered to all the voltage detection circuits 101, 102 and 103 connected in the daisy chain, and only the voltage detection circuit having become a target transmits reply data. The reply data is sequentially delivered through the daisy chain, and the MCU receives the returned data.

PRIOR ART DOCUMENT

Patent Document

[Patent Document 1] Japanese Patent No. JP5503924B2

SUMMARY OF THE INVENTION

Problems to be Solved by the Invention

In the conventional example, the frequency of data transmission in the downstream voltage detection circuit close to the MCU is higher, and the frequency of data transmission in the upstream voltage detection circuit distant from the MCU, is lower. As a result, in current consumption or power consumption during data communication, a difference generates between the voltage detection circuits, resulting in nonuniformity of the plurality of cell voltages.

An object of the present invention is to reduce variations in power consumption during communication among a plurality of voltage detection circuits.

Means For Dissolving the Problems

According to one aspect of the present invention, there is provided a voltage detection circuit for measuring each cell voltage of an assembled battery configured by connecting a plurality of cells in series. The voltage detection circuit is defined as a first voltage detection circuit. The voltage detection circuit includes:

a reply signal generation circuit that generates a reply signal containing data detected by the first voltage detection circuit;

an upstream transfer circuit that transfers a signal received by an upstream communication circuit to downstream;

a dummy current consumption circuit that consumes a predetermined dummy current; and a control circuit that controls the reply signal generation circuit, the upstream transfer circuit, and the dummy current consumption circuit to selectively operate any one of the reply signal generation circuit, the upstream transfer circuit, and the dummy current consumption circuit, based on a communication command signal.

Effect of the Invention

Therefore, according to the present invention, based on a communication command signal received from the host apparatus, the control circuit controls the reply signal generation circuit, the upstream transfer circuit, and the dummy current consumption circuit to selectively operate one of them. As a result, it is possible to reduce variations in power consumption during communication among the plurality of voltage detection circuits and make the power consumption uniform.

MODE FOR CARRYING OUT THE INVENTION

Figure 1A:
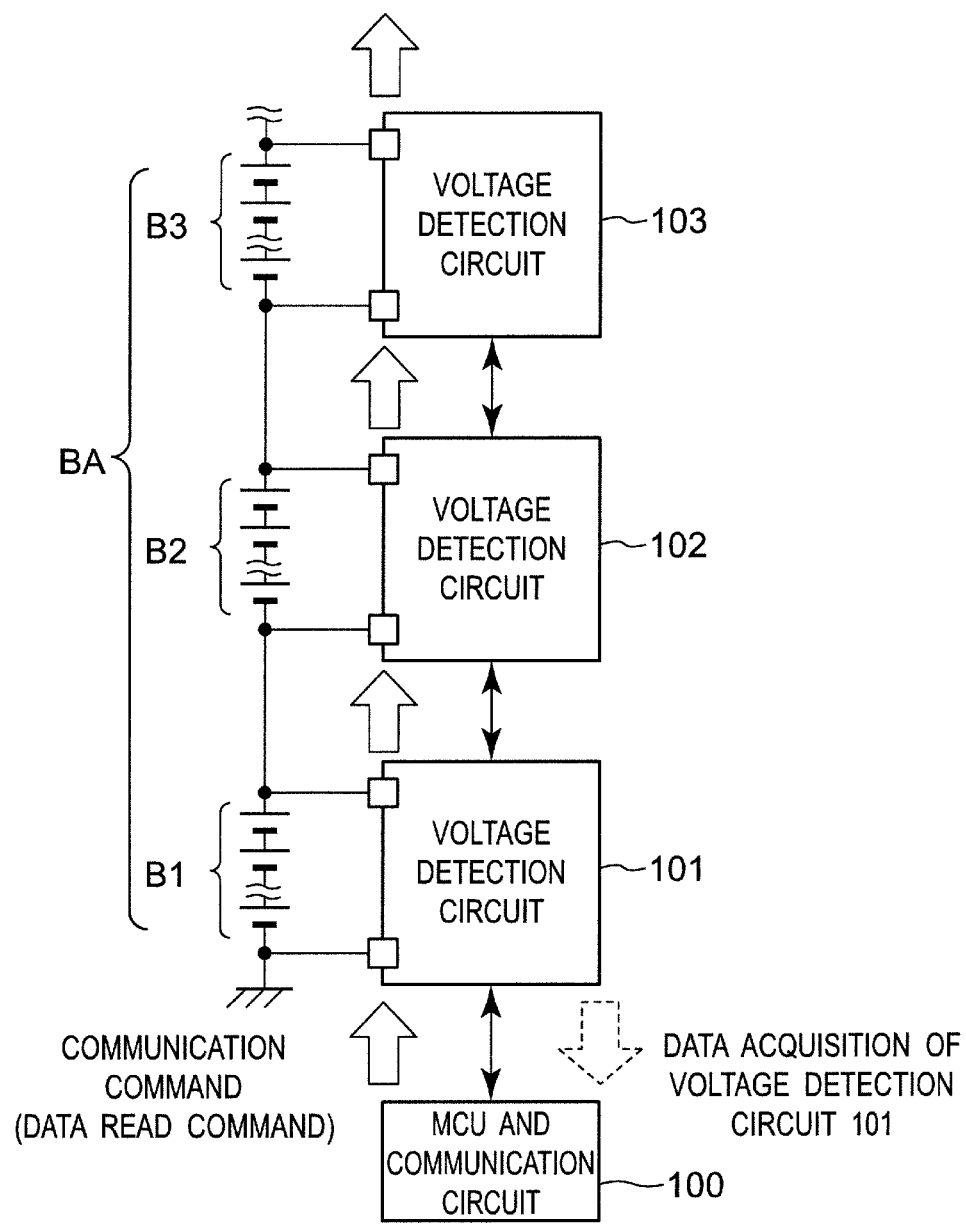
FIG. 1A is a block diagram of a voltage measurement apparatus showing data acquisition from a voltage detection circuit 101 in a voltage measurement apparatus of a conventional example.
Figure 1B:
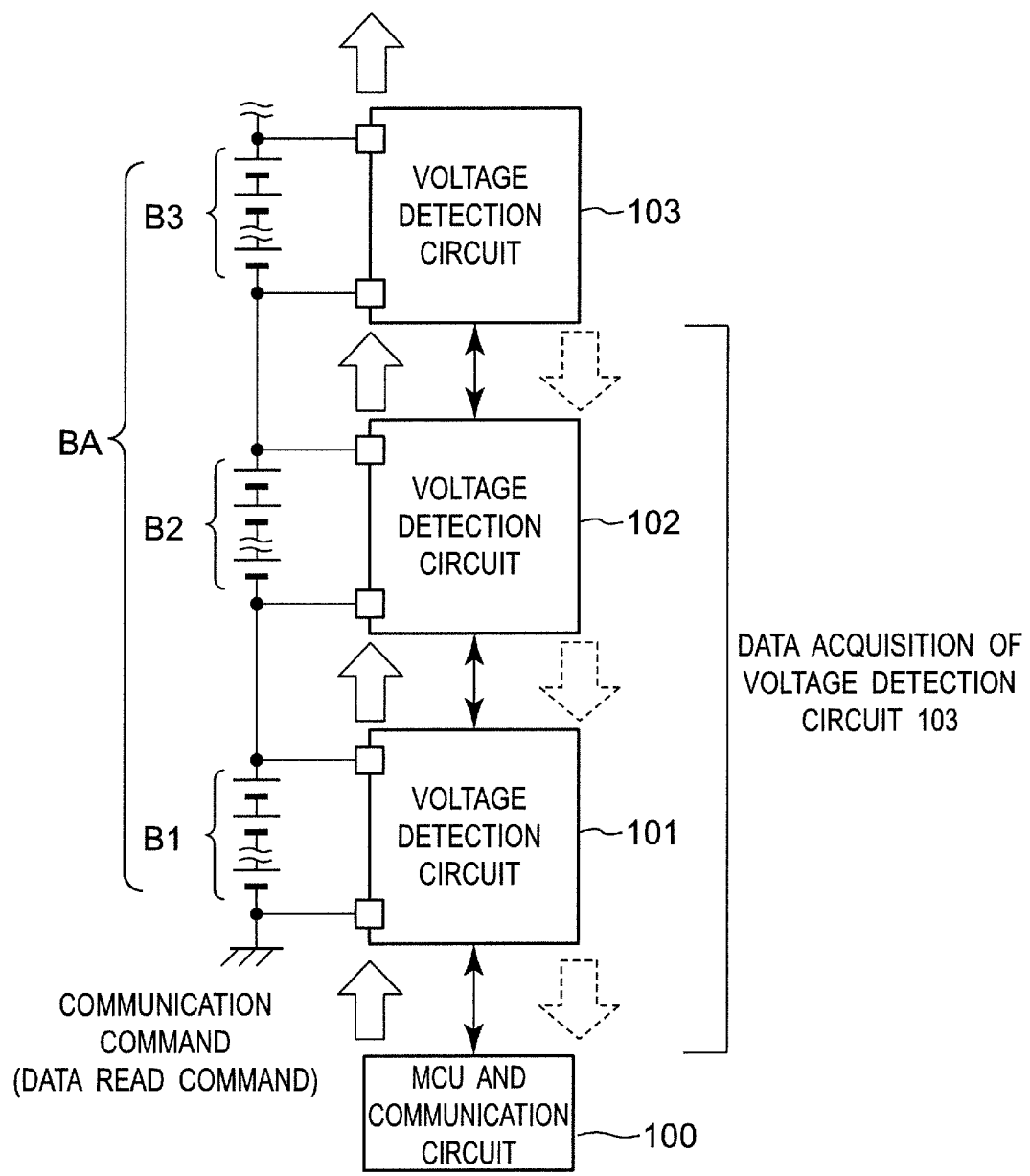
FIG. 1B is a block diagram of the voltage measurement apparatus showing data acquisition from a voltage detection circuit 103 in the voltage measurement apparatus of the conventional example.

Hereinafter, embodiments of the present invention will be described. In this case, the same or similar constituent elements will be provided with the same reference numerals, and the detailed description thereof will be omitted.

First Embodiment

Figure 2:
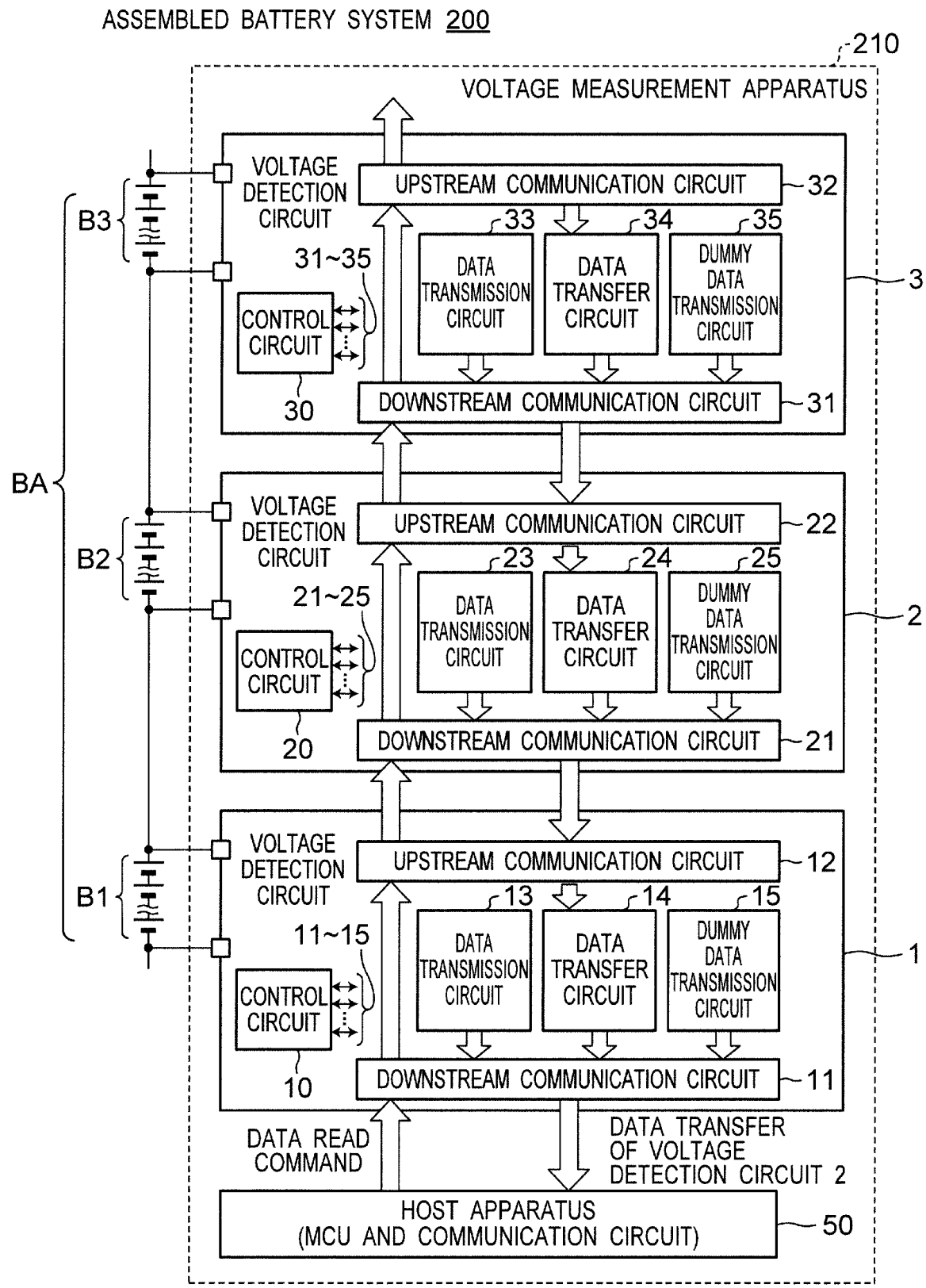
FIG. 2 is a block diagram showing a configuration example of voltage detection circuits 1, 2 and 3, a voltage measurement apparatus 210, and an assembled battery system 200 according to a first embodiment of the present invention.

FIG. 2 is a block diagram showing a configuration example of voltage detection circuits 1, 2 and 3, a voltage measurement apparatus 210, and an assembled battery system 200 according to a first embodiment of the present invention.

Referring to FIG. 2, the assembled battery system 200 is configured to include an assembled battery BA configured by connecting a plurality of cells B1, B2 and B3 in series and a voltage measurement apparatus 210. In this case, the voltage measurement apparatus 210 includes a host apparatus 50 made up of a micro control unit (MCU) and a communication circuit, and three voltage detection circuits 1, 2 and 3. The respective voltage detection circuits 1, 2 and 3 are provided for measuring the cell voltages of the respective cells B1, B2 and B3 of the assembled battery BA. It is noted that the cell voltages of the respective cells B1, B2 and B3 of the assembled battery BA are set to be the same, for example, when the voltage detection circuits 1, 2 and 3 are not connected. In this case, the host apparatus 50 and the voltage detection circuits 1, 2 and 3 are connected in series in a daisy chain via, for example, a wired line. In this case, a circuit close to the host apparatus 50 is referred to as a "downstream circuit", and a circuit distant from the host apparatus 50 is referred to as an "upstream circuit", and the same applies to the other embodiments.

The voltage detection circuit 1 includes a control circuit 10, a downstream communication circuit 11, an upstream communication circuit 12, a data transmission circuit 13, a data transfer circuit 14, and a dummy data transmission circuit 15. The downstream communication circuit 11 has a function of receiving data from the host apparatus 50 and a function of transmitting data to the host apparatus 50. The upstream communication circuit 12 has a function of transferring data from the host apparatus 50 to the other voltage detection circuits 2, 3 and a function of receiving data from the other voltage detection circuits 2, 3. Based on the data including a data readout command received by the downstream communication circuit 11 from the host apparatus 50, the control circuit 10 selects any one of the following circuits:

(1) the data transmission circuit 13 that transmits battery data (including information such as a cell voltage, the same applies hereinafter) of the cell B1;

(2) the dummy data transmission circuit 15 that transmits predetermined dummy data; and (3) the data transfer circuit 14 that transfers data received by the upstream communication circuit 12.

Then the control circuit 10 controls the downstream communication circuit 11 to transmit data from the selected circuit to the host apparatus 50. The control circuit 10 also controls communication operations of the downstream communication circuit 11 and the upstream communication circuit 12.

The data including the data readout command from the host apparatus 50 includes cell addressing data indicating battery data of which of the cells B1, B2 and B3 is to be read out, and the data is transmitted from the downstream communication circuit 11 to the voltage detection circuit 2 via the upstream communication circuit 12.

(A) When the cell addressing data is addressed to the cell B1, the control circuit 10 controls the data transmission circuit 13 and the downstream communication circuit 11 such that the battery data of the cell B1 is transmitted from the data transmission circuit 13 to the host apparatus 50 via the downstream communication circuit 11.

(B) When the cell addressing data is addressed to the cell B2 or B3 located at the side of upstream which is more distant than the voltage detection circuit 1 as seen from the host apparatus 50, the control circuit 10 controls the data transfer circuit 14 to transmit the data received by the upstream communication circuit 12 to the host apparatus 50 via the downstream communication circuit 11.

(C) When the cell addressing data is addressed to a cell located at the side of downstream which is closer than the voltage detection circuit 1 as seen from the host apparatus 50, there is no cell located at the side of downstream of the cell B1. Therefore, the control circuit 10 does not control the dummy data transmission circuit 15 to generate dummy data and transmit the generated data to the host apparatus 50.

The voltage detection circuit 2 includes a control circuit 20, a downstream communication circuit 21, an upstream communication circuit 22, a data transmission circuit 23, a data transfer circuit 24, and a dummy data transmission circuit 25. The downstream communication circuit 21 has a function of receiving data from the host apparatus 50 via the voltage detection circuit 1 and a function of transmitting data to the host apparatus 50 via the voltage detection circuit 1. The upstream communication circuit 22 has a function of transferring data received from the host apparatus 50 via the voltage detection circuit 1 to the other voltage detection circuit 3 and a function of receiving data from the other voltage detection circuit 3. Based on the data including the data readout command received by the downstream communication circuit 21 from the host apparatus 50 via the voltage detection circuit 1, the control circuit 20 selects any one of the following circuits:

(1) the data transmission circuit 23 that transmits battery data of the cell B2;

(2) the dummy data transmission circuit 25 that transmits predetermined dummy data; and (3) the data transfer circuit 24 that transfers data received by the upstream communication circuit 22.

Then, the control circuit 20 controls the downstream communication circuit 21 to transmit data from the selected circuit to the host apparatus 50 via the voltage detection circuit 1. The control circuit 20 also controls communication operations of the downstream communication circuit 21 and the upstream communication circuit 22.

The data including the data readout command received from the host apparatus 50 via the voltage detection circuit 1 includes cell addressing data indicating battery data of which of the cells B1, B2 and B3 is to be read out. The data is transmitted from the downstream communication circuit 21 to the voltage detection circuit 3 via the upstream communication circuit 22.

(A) When the cell addressing data is addressed to the cell B2, the control circuit 20 controls the data transmission circuit 23 and the downstream communication circuit 21 such that the battery data of the cell B2 is transmitted from the data transmission circuit 23 to the host apparatus 50 via the downstream communication circuit 21 and the voltage detection circuit 1.

(B) When the cell addressing data is addressed to the cell B3 located at the side of upstream which is more distant than the voltage detection circuit 1 as seen from the host apparatus 50, the control circuit 20 controls the data transfer circuit 24 to transmit the data received by the upstream communication circuit 22 to the host apparatus 50 via the downstream communication circuit 21 and the voltage detection circuit 1.

(C) When the cell addressing data is addressed to the cell B1 located at the side of downstream which is closer than the voltage detection circuit 1 as seen from the host apparatus 50, the control circuit 20 controls the dummy data transmission circuit 25 to generate dummy data and transmit the generated data to the host apparatus 50.

The voltage detection circuit 3 includes a control circuit 30, a downstream communication circuit 31, an upstream communication circuit 32, a data transmission circuit 33, a data transfer circuit 34, and a dummy data transmission circuit 35. The downstream communication circuit 31 has a function of receiving data from the host apparatus 50 via the voltage detection circuits 1 and 2, and a function of transmitting data to the host apparatus 50 via the voltage detection circuits 2 and 1. The upstream communication circuit 32 has a function of transferring data received from the host apparatus 50 via the voltage detection circuits 1 and 2 to the other voltage detection circuit located at the side of upstream (there is no such circuit in the configuration example of FIG. 2) and a function of receiving data from the other voltage detection circuit. Based on the data including the data readout command received by the downstream communication circuit 31 from the host apparatus 50 via the voltage detection circuits 1 and 2, the control circuit 30 selects any one of the following circuits:

(1) the data transmission circuit 33 that transmits battery data of the cell B3;

(2) the dummy data transmission circuit 35 that transmits predetermined dummy data; and (3) the data transfer circuit 34 that transfers data received by the upstream communication circuit 32.

Then the control circuit 30 controls the downstream communication circuit 31 such that the downstream communication circuit 31 transmits data from the selected circuit to the host apparatus 50 via the voltage detection circuits 2, 1. The control circuit 30 also controls communication operations of the downstream communication circuit 31 and the upstream communication circuit 32. When the voltage detection circuit 3 is a voltage detection circuit located most upstream, the upstream communication circuit 32 does not receive data from the upstream voltage detection circuit.

The data including the data readout command received from the host apparatus 50 via the voltage detection circuits 1 and 2 includes cell addressing data indicating battery data of which of the cells B1, B2 and B3 is to be read out. The data is transmitted from the downstream communication circuit 31 to the other voltage detection circuit via the upstream communication circuit 32.

(A) When the cell addressing data is addressed to the cell B3, the control circuit 30 controls the data transmission circuit 33 and the downstream communication circuit 31 such that the battery data of the cell B3 is transmitted from the data transmission circuit 33 to the host apparatus 50 via the downstream communication circuit 31 and the voltage detection circuits 2 and 1.

(B) When the cell addressing data is addressed to the cell located at the side of upstream which is more distant than the voltage detection circuit 1 as seen from the host apparatus 50, there is no cell located at the side of downstream of the cell B1. Therefore, the control circuit 30 does not control the data transfer circuit 34 to transmit the data received by the upstream communication circuit 32 to the host apparatus 50 via the downstream communication circuit 31 and the voltage detection circuits 1 and 2.

(C) When the cell addressing data is addressed to the cell B1 or B2 located at the side of downstream which is closer than the voltage detection circuit 1 as seen from the host apparatus 50, the control circuit 30 controls the dummy data transmission circuit 35 to generate dummy data and transmit the generated data to the host apparatus 50.

As described above, according to the present embodiment, (A) When the data including the data readout command received from the host apparatus 50 is directed to the self-voltage detection circuit 1, 2, or 3 (when the cell addressing data addresses the self-cell B1, B2, or B3), the control circuit 10, 20, or 30 controls the corresponding data transmission circuit 13, 23, or 24 to transmit data including the battery data of the corresponding cell B1, B2, or B3 to the host apparatus 50.

(B) When the data including the data readout command received from the host apparatus 50 is an upstream voltage detection circuit more distant from the host apparatus 50 side than the self-voltage detection circuit 1, 2, or 3 (when the cell addressing data addresses a cell located at the side of upstream of the self-cell B1, B2, or B3), the control circuit 10, 20, or 30 controls the data transfer circuits 14, 24, or 34 to transmit and transfer the data received by the upstream communication circuit 12, 22, or 32 to the host apparatus 50 via the downstream communication circuit 11, 21, or 31.

(C) When the data including the data readout command received from the host apparatus 50 is a downstream voltage detection circuit closer to the host apparatus 50 side than the self-voltage detection circuit 1, 2, or 3 (when the cell addressing data addresses a cell located at the side of downstream of the self-cell B1, B2, or B3), the control circuit 10, 20, or 30 controls the dummy data transmission circuit 15, 25, or 35 to generate dummy data and transmit the generated data to the host apparatus 50 via the downstream communication circuit 11, 21, or 31.

According to the present embodiment, at the time of data readout from any of the voltage detection circuits 1, 2 and 3, the voltage detection circuit 1, 2, or 3 selectively operates any one of the data transmission circuit 13, 23, or 33, the data transfer circuit 14, 24, or 34, and the dummy data transmission circuit 15, 25, or 35. As a result, it is possible to reduce the difference in current consumption related to data communication among the voltage detection circuits 1, 2 and 3, equalize the current consumption or the power consumption of each of the voltage detection circuits 1, 2 and 3 that operates with each of the cell voltages of the cells B1, B2 and B3, and make each of the cell voltages uniform.

In the embodiment described above, when the data received from the host apparatus 50 side is directed to the self-voltage detection circuit 1, 2, or 3 or the voltage detection circuit 1, 2, or 3 closer to the host apparatus 50 side than the self-voltage detection circuit 1, 2, or 3, the upstream communication circuit 12, 22, or 32 does not receive data. Hence it is possible to prevent transmission of the dummy data from affecting communication of the downstream voltage detection circuit.

Figure 3:
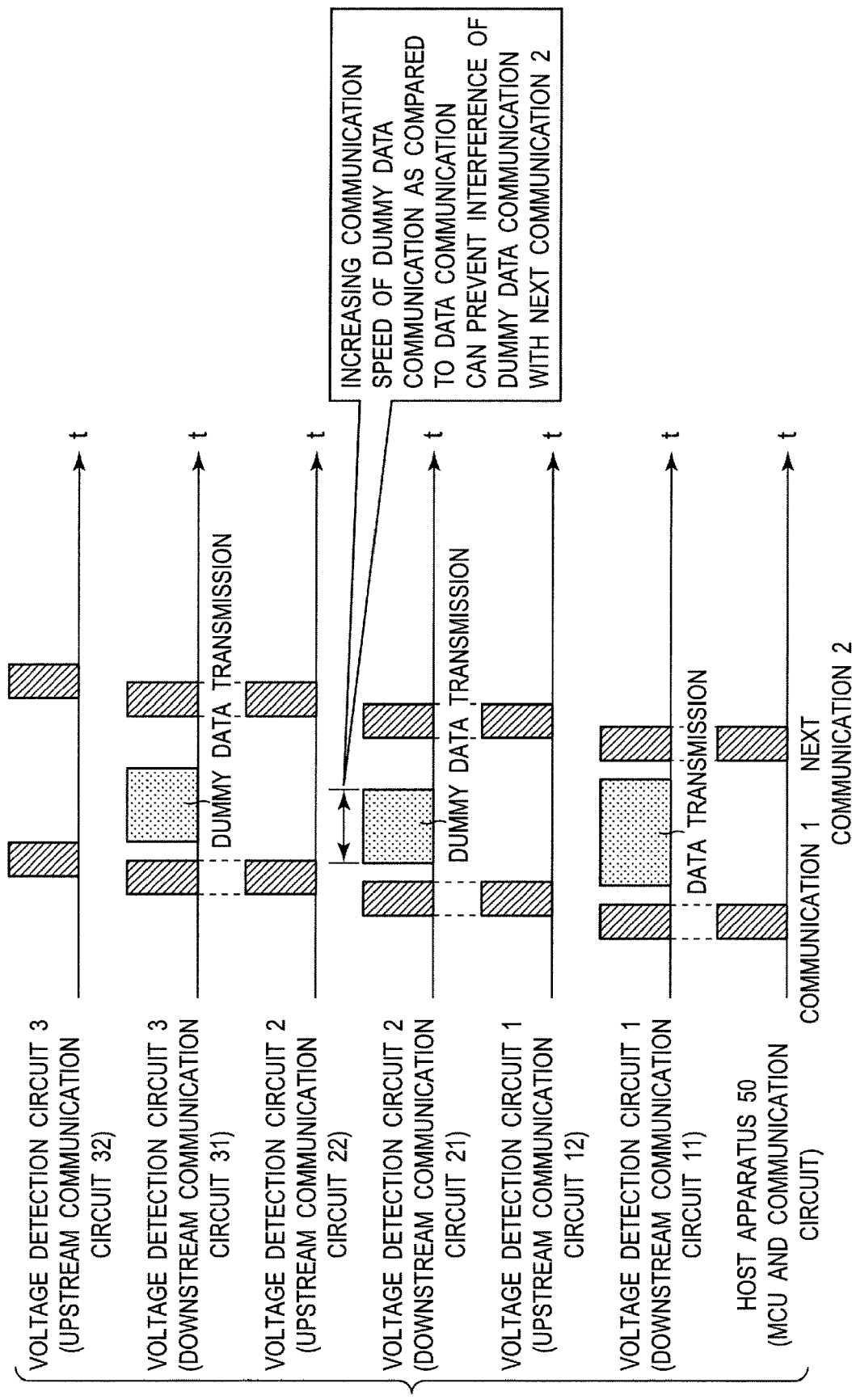
FIG. 3 is a timing chart showing an operation example of the assembled battery system 200 of FIG. 2.

FIG. 3 is a timing chart showing an operation example of the assembled battery system 200 of FIG. 2.

As shown in FIG. 3, by performing transmission of the dummy data at a high communication speed as compared to transmission of data related to ordinary battery data, it is possible to prevent the transmission of the dummy data from interfering with transmission of next data. In addition, when increasing of the communication speed affects the power consumption, by setting the current consumption during communication upon transmitting the dummy data to a predetermined value so that the power consumption is the same as that upon transmitting the data, it is possible to equalize the current consumption or the power consumption among the voltage detection circuits 1, 2 and 3.

For example, even when the data is transmitted at the same communication speed, the time for transferring the data may vary among the voltage detection circuits 1, 2 and 3 due to an influence such as variations in reference clock frequency among the voltage detection circuits 1, 2 and 3. If the transmission of the dummy data delays behind the transmission of the data, the transmission of the dummy data may not be in time for the next communication and interferes with the next communication, thus causing a communication error. In the present embodiment, by performing the transmission of the dummy data at a high communication speed as compared to transmission of ordinary data, it is possible to prevent the above interference and avoid the communication error.

In the case of a scheme in which the communication speed affects the current consumption, by compensating the current consumption during communication to obtain the same power consumption as that upon the data transmission, it is possible to compensate the power consumption for the speed change and reduce variations in power consumption among the voltage detection circuits 1, 2 and 3.

Second Embodiment

Figure 4:
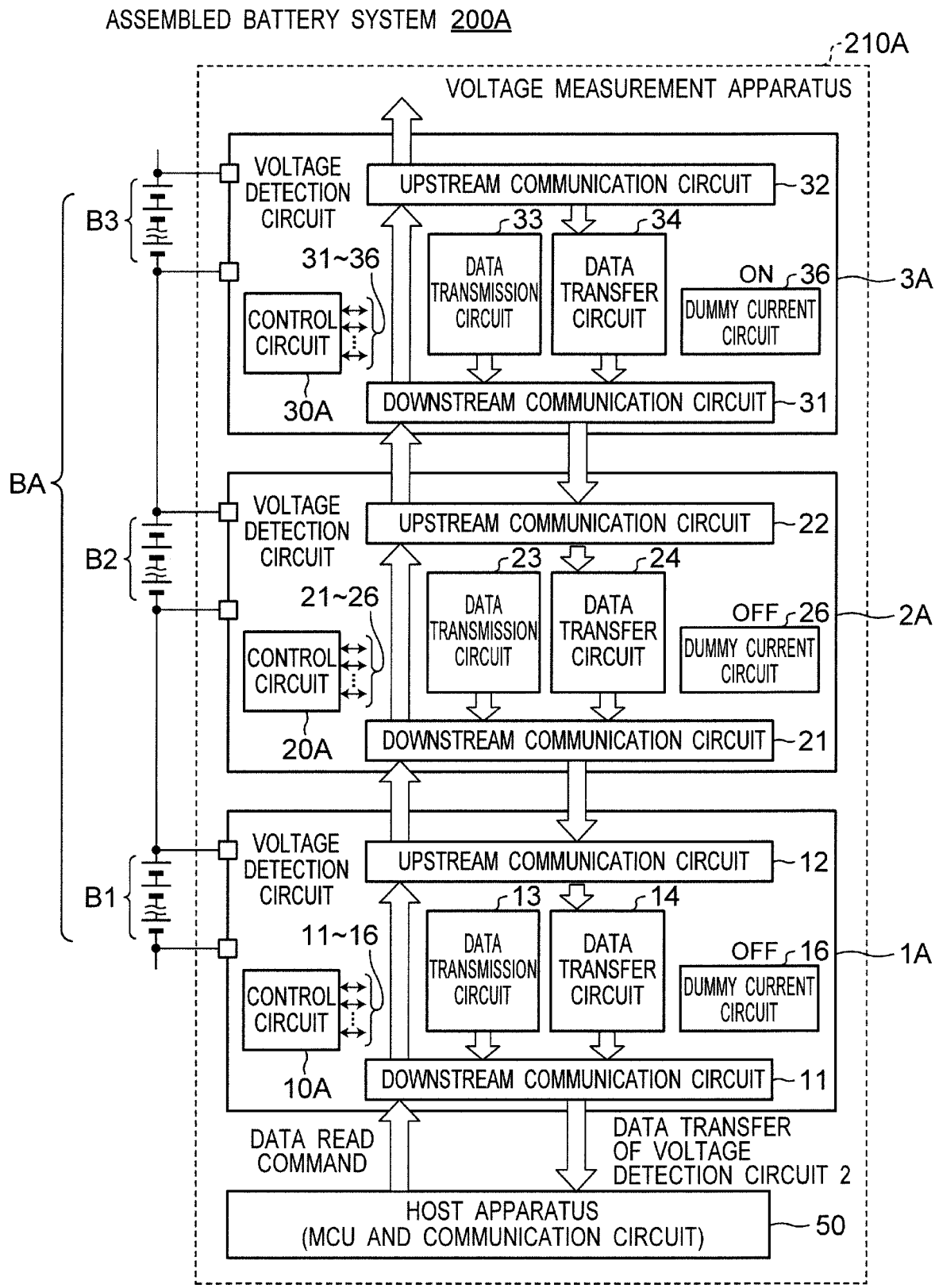
FIG. 4 is a block diagram showing a configuration example of voltage detection circuits 1A, 2A and 3A, a voltage measurement apparatus 210A, and an assembled battery system 200A according to a second embodiment of the present invention.

FIG. 4 is a block diagram showing a configuration example of voltage detection circuits 1A, 2A and 3A, a voltage measurement apparatus 210A, and an assembled battery system 200A according to a second embodiment of the present invention.

Referring to FIG. 4, the assembled battery system 200A is configured to include an assembled battery BA and the voltage measurement apparatus 210A. The voltage measurement apparatus 210A includes a host apparatus 50 and three voltage detection circuits 1A, 2A and 3A. Therefore, as compared to the voltage measurement apparatus 210 of FIG. 2, the voltage measurement apparatus 210A is characterized by including three voltage detection circuits 1A, 2A and 3A in place of three voltage detection circuits 1, 2 and 3.

As compared to the voltage detection circuit 1 of FIG. 2, the voltage detection circuit 1A is characterized by:

(1) including a control circuit 10A in place of the control circuit 10; and (2) including a dummy current circuit 16 in place of the dummy data transmission circuit 15. That is, the control circuit 10A contributes to the uniformity of current consumption or power consumption by controlling the dummy current circuit 16 to operate and generate a dummy current instead of causing the dummy data transmission circuit 15 to perform the transmission operation.

As compared to the voltage detection circuit 2 of FIG. 2, the voltage detection circuit 2A is characterized by:

(1) including a control circuit 20A in place of the control circuit 20; and (2) including a dummy current circuit 26 in place of the dummy data transmission circuit 25. That is, the control circuit 20A contributes to the uniformity of current consumption or power consumption by controlling the dummy current circuit 26 to operate and generate a dummy current instead of causing the dummy data transmission circuit 25 to perform the transmission operation.

As compared to the voltage detection circuit 3 of FIG. 2, the voltage detection circuit 3A is characterized by:

(1) including a control circuit 30A in place of the control circuit 30; and (2) including a dummy current circuit 36 in place of the dummy data transmission circuit 35. That is, the control circuit 30A contributes to the uniformity of current consumption or power consumption by controlling the dummy current circuit 36 to operate and generate a dummy current instead of causing the dummy data transmission circuit 35 to perform the transmission operation.

That is, the control circuits 10A, 20A, 30A control the current value and the on-time of the dummy current circuits 16, 26, 36 such that the power consumption is equal to that upon the data transmission.

Therefore, according to the present embodiment, at the time of data readout from any of the voltage detection circuits 1A, 2A and 3A, the voltage detection circuit 1A, 2A, or 3A that transmits no data consumes equivalent current by the dummy current circuit 16, 26, or 36, so that it is possible to reduce the difference in current consumption or power consumption in the data transmission among the circuits and make each of the cell voltages uniform.

Third Embodiment

Figure 5:
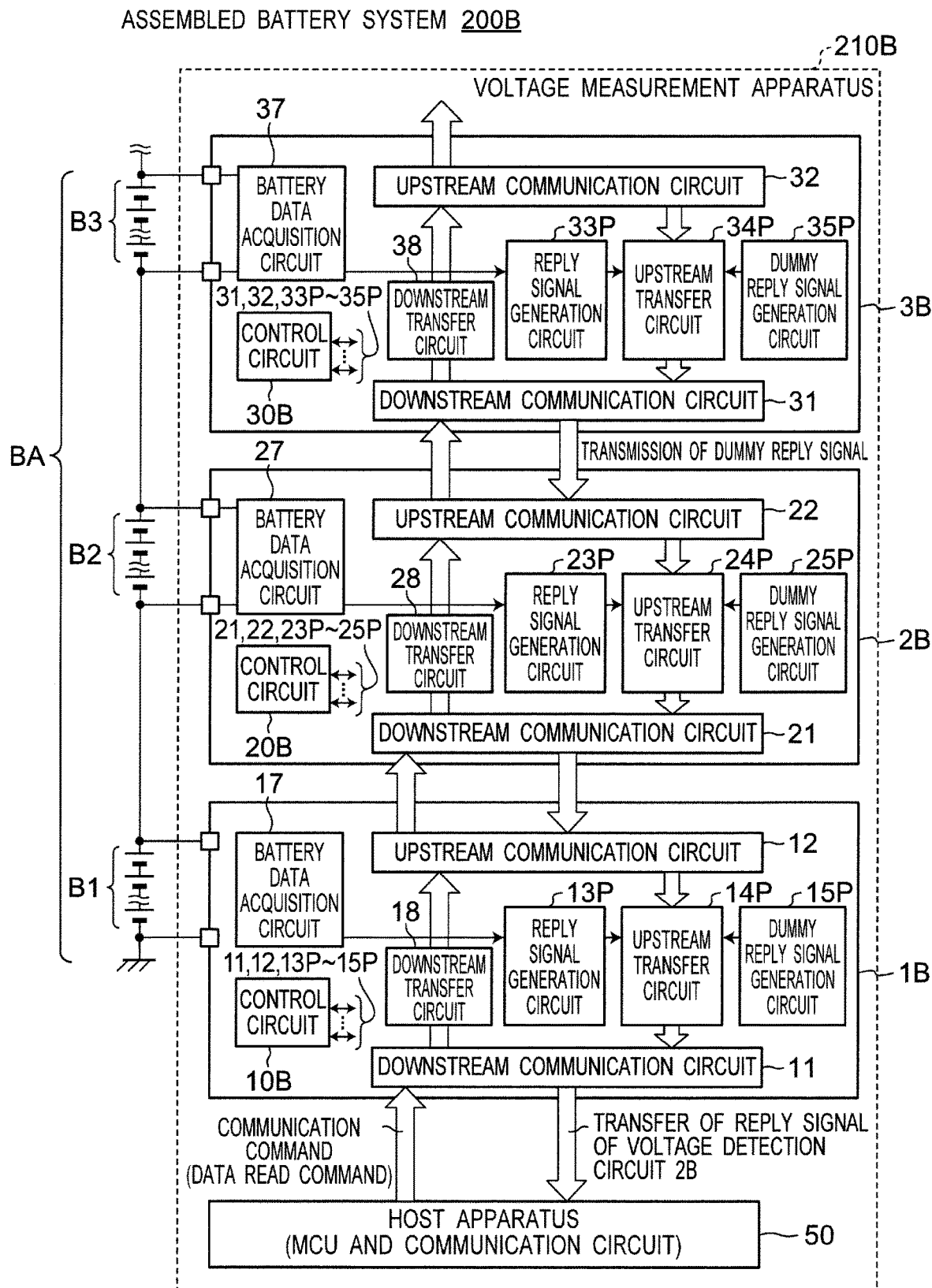
FIG. 5 is a block diagram showing a configuration example of voltage detection circuits 1B, 2B and 3B, a voltage measurement apparatus 210B, and an assembled battery system 200B according to a third embodiment of the present invention.

FIG. 5 is a block diagram showing a configuration example of voltage detection circuits 1B, 2B and 3B, a voltage measurement apparatus 210B, and an assembled battery system 200B according to a third embodiment of the present invention. Referring to FIG. 5, the assembled battery system 200B is a detailed embodiment, which is made by concretely describing the assembled battery system 200 of FIG. 2. As compared to the assembled battery system 200 of FIG. 2, the voltage detection circuits 1B, 2B and 3B are provided in place of the voltage detection circuits 1, 2 and 3, respectively.

Referring to FIG. 5, the assembled battery system 200B includes an assembled battery BA configured by connecting cells B1, B2 and B3 in series and the voltage measurement apparatus 210B. In the voltage measurement apparatus 210B, a host apparatus 50 and three voltage detection circuits 1B, 2B and 3B are connected in series in a daisy chain via, for example, a wired line.

The voltage detection circuit 1B differs from the voltage detection circuit 1 of FIG. 2 in the following points:

(1) In place of the control circuit 10, a control circuit 10B is provided.

(2) A battery data acquisition circuit 17 and a downstream transfer circuit 18 are explicitly specified.

(3) In place of the data transmission circuit 13, a reply signal generation circuit 13P corresponding to the data transmission circuit 13 is provided.

(4) In place of the data transfer circuit 14, an upstream transfer circuit 14P corresponding to the data transfer circuit 14 is provided.

(5) In place of the dummy data transmission circuit 15, a dummy reply signal generation circuit 15P corresponding to the dummy data transmission circuit 15 is provided.

The voltage detection circuit 2B differs from the voltage detection circuit 2 of FIG. 2 in the following points:

(1) In place of the control circuit 20, a control circuit 20B is provided.

(2) A battery data acquisition circuit 27 and a downstream transfer circuit 28 are explicitly specified.

(3) In place of the data transmission circuit 23, a reply signal generation circuit 23P corresponding to the data transmission circuit 23 is provided.

(4) In place of the data transfer circuit 24, an upstream transfer circuit 24P corresponding to the data transfer circuit 24 is provided.

(5) In place of the dummy data transmission circuit 25, a dummy reply signal generation circuit 25P corresponding to the dummy data transmission circuit 25 is provided.

The voltage detection circuit 3B differs from the voltage detection circuit 3 of FIG. 2 in the following points:

(1) In place of the control circuit 30, a control circuit 30B is provided.

(2) A battery data acquisition circuit 37 and a downstream transfer circuit 38 are explicitly specified.

(3) In place of the data transmission circuit 33, a reply signal generation circuit 33P corresponding to the data transmission circuit 33 is provided.

(4) In place of the data transfer circuit 34, an upstream transfer circuit 34P corresponding to the data transfer circuit 34 is provided.

(5) In place of the dummy data transmission circuit 35, a dummy reply signal generation circuit 35P corresponding to the dummy data transmission circuit 35 is provided.

Referring to FIG. 5, the host apparatus 50 transmits a communication command having a data readout command that includes cell addressing data to the voltage detection circuits 1B, 2B and 3B. When the cell addressing data in the communication command from the host apparatus 50 is the cell B1, the voltage detection circuit 1B transmits a reply signal containing the battery data acquired by the voltage detection circuit 1B to the host apparatus 50. When the cell addressing data in the communication command from the host apparatus 50 is the cell B2, the voltage detection circuit 2B transmits a reply signal containing the battery data acquired by the voltage detection circuit 2B to the host apparatus 50 via the voltage detection circuit 1B. When the cell addressing data in the communication command from the host apparatus 50 is the cell B3, the voltage detection circuit 3B transmits a reply signal containing the battery data acquired by the voltage detection circuit 3B to the host apparatus 50 via the voltage detection circuits 2B, 1B. When each of the voltage detection circuits 1B, 2B and 3B is not transmitting the reply signal containing the self-battery data or not transferring the reply signal from the other voltage detection circuit (by each of the upstream transfer circuits 14P, 24P and 34P), each of the dummy reply signal generation circuits 15P, 25P and 35P generates a dummy reply signal and transmits the generated signal to the host apparatus 50 in order to make the cell voltages uniform, in a manner similar to that of the first embodiment.

Hereinafter, configurations of the voltage detection circuits 1B, 2B and 3B will be described with reference to FIGS. 6A to 6C.

Figure 6A:
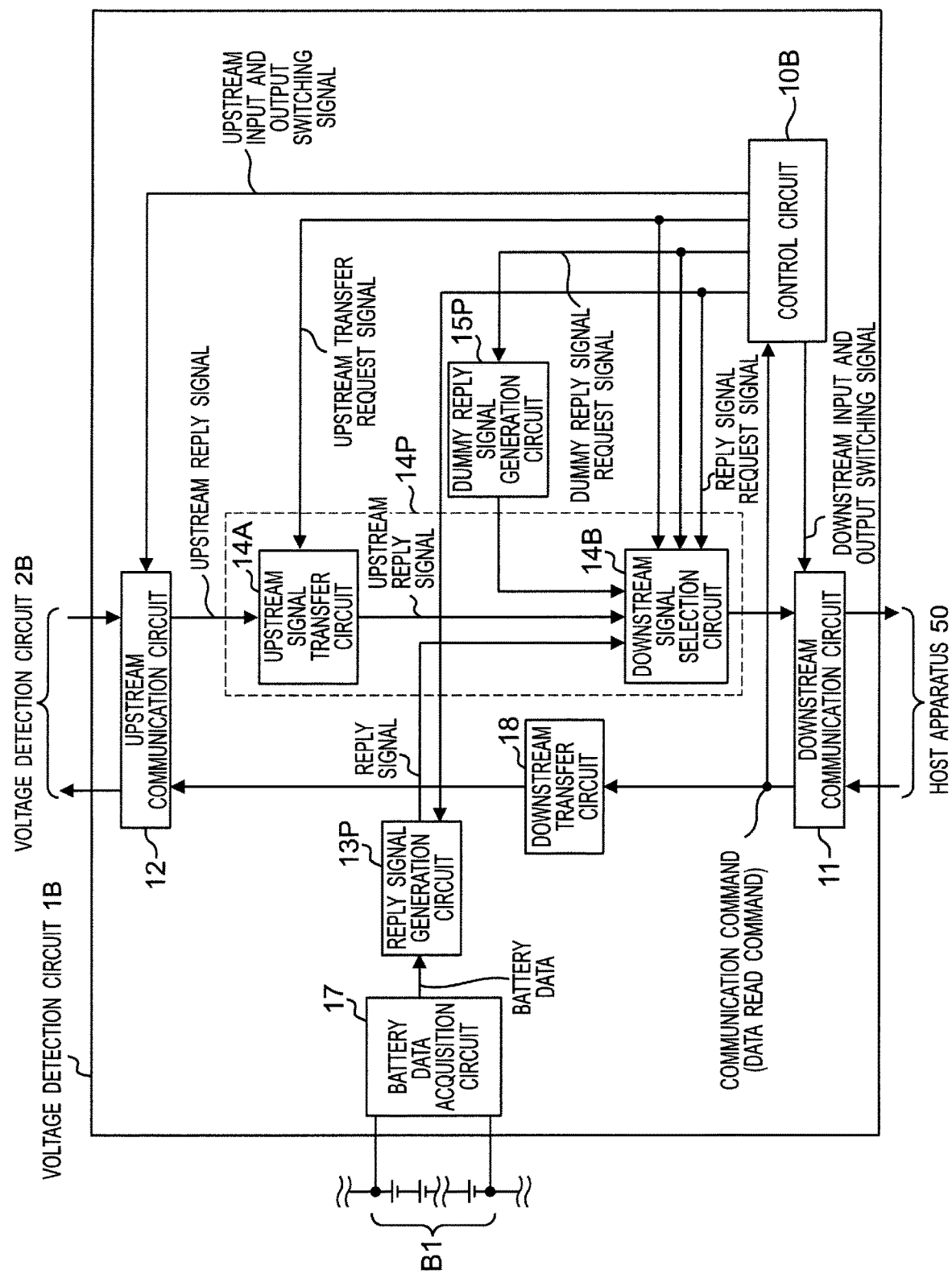
FIG. 6A is a block diagram showing a detailed configuration example of the voltage detection circuit 1B of FIG. 5.

FIG. 6A is a block diagram showing a detailed configuration example of the voltage detection circuit 1B of FIG. 5. Referring to FIG. 6A, the upstream transfer circuit 14P is configured to include an upstream signal transfer circuit 14A and a downstream signal selection circuit 14B. In this case, the downstream signal selection circuit 14B performs as follows:

(1) When receiving a reply signal request signal from the control circuit 10B, the downstream signal selection circuit 14B selects a reply signal from the reply signal generation circuit 13P, and outputs the selected signal to the downstream communication circuit 11.

(2) When receiving an upstream transfer request signal from the control circuit 10B, the downstream signal selection circuit 14B selects an upstream reply signal from the upstream signal transfer circuit 14A, and outputs the selected signal to the downstream communication circuit 11.

(3) When receiving a dummy reply signal request signal from the control circuit 10B, the downstream signal selection circuit 14B selects a dummy reply signal from the dummy reply signal generation circuit 15P, and outputs the selected signal to the downstream communication circuit 11.

Referring to FIG. 6A, the battery data acquisition circuit 17 measures the cell voltage of the cell B1, generates battery data including data of the cell voltage, and outputs the generated battery data to the reply signal generation circuit 13P. Based on a downstream input and output switching signal (input instruction) from the control circuit 10B, the downstream communication circuit 11 receives the communication command from the host apparatus 50 to output the received command to the control circuit 10B, and transmits the received command to the voltage detection circuit 2B via the downstream transfer circuit 18 and the upstream communication circuit 12. In addition, based on the downstream input and output switching signal (output instruction) from the control circuit 10B, the downstream communication circuit 11 transmits a signal from the downstream signal selection circuit 14B to the host apparatus 50. Based on an upstream input and output switching signal (output instruction) from the control circuit 10B, the upstream communication circuit 12 transmits to the voltage detection circuit 2B the communication command inputted from the host apparatus 50 via the downstream communication circuit 11 and the downstream transfer circuit 18. In addition, based on the upstream input and output switching signal (input instruction) from the control circuit 10B, the upstream communication circuit 12 receives an upstream reply signal from the voltage detection circuit 2B, and transmits the upstream reply signal to the host apparatus 50 via the following:

(1) the upstream signal transfer circuit 14A that performs a transfer operation based on the upstream transfer request signal from the control circuit 10B;

(2) the downstream signal selection circuit 14B that performs a selection operation based on the upstream transfer request signal from the control circuit 10B; and (3) the downstream communication circuit 11 that performs a transmission operation based on the downstream input and output switching signal (output instruction) from the control circuit 10B.

(A) In a wait state of the communication command from the host apparatus 50, the control circuit 10B outputs the downstream input and output switching signal (input instruction) to the downstream communication circuit 11, and outputs the upstream input and output switching signal (output instruction) to the upstream communication circuit 12. When receiving the communication command from the host apparatus 50, the control circuit 10B performs control as follows by outputting the downstream input and output switching signal (output instruction) to the downstream communication circuit 11, and outputting the upstream input and output switching signal (input instruction) to the upstream communication circuit 12. Thereafter, the control circuit 10B returns to the wait state of the communication command from the host apparatus 50.

(B) When the self-cell B1 is explicitly specified as the data readout command in the communication command received by the downstream communication circuit 11, the control circuit 10B outputs the reply signal request signal to the reply signal generation circuit 13P and the downstream signal selection circuit 14B. At this time, the reply signal generation circuit 13P generates a reply signal containing battery data on the cell voltage of the cell B1, and transmits the reply signal to the host apparatus 50 via the downstream signal selection circuit 14B and the downstream communication circuit 11.

(C) When the cells B2 and B3 of the voltage detection circuits 2B and 3B located at the side of upstream of the voltage detection circuit 1B are explicitly specified as the data readout command in the communication command received by the downstream communication circuit 11, the control circuit 10B outputs the upstream transfer request signal to the upstream signal transfer circuit 14A and the downstream signal selection circuit 14B. At this time, the upstream communication circuit 12 transmits the received upstream reply signal to the host apparatus 50 via the upstream signal transfer circuit 14A, the downstream signal selection circuit 14B, and the downstream communication circuit 11.

(D) When the cell of the voltage detection circuit located at the side of downstream of the voltage detection circuit 1B is explicitly specified as the data readout command in the communication command received by the downstream communication circuit 11, the control circuit 10B transmits the dummy reply signal request signal to the dummy reply signal generation circuit 15P and the downstream signal selection circuit 14B. At this time, the dummy reply signal generation circuit 15P generates a predetermined dummy reply signal and transmits the generated signal to the host apparatus 50 via the downstream signal selection circuit 14B and the downstream communication circuit 11. In the case of the voltage detection circuit 1B, this operation does not exist because there is no voltage detection circuit located at the side of downstream or no cell located at the side of downstream.

Figure 6B:
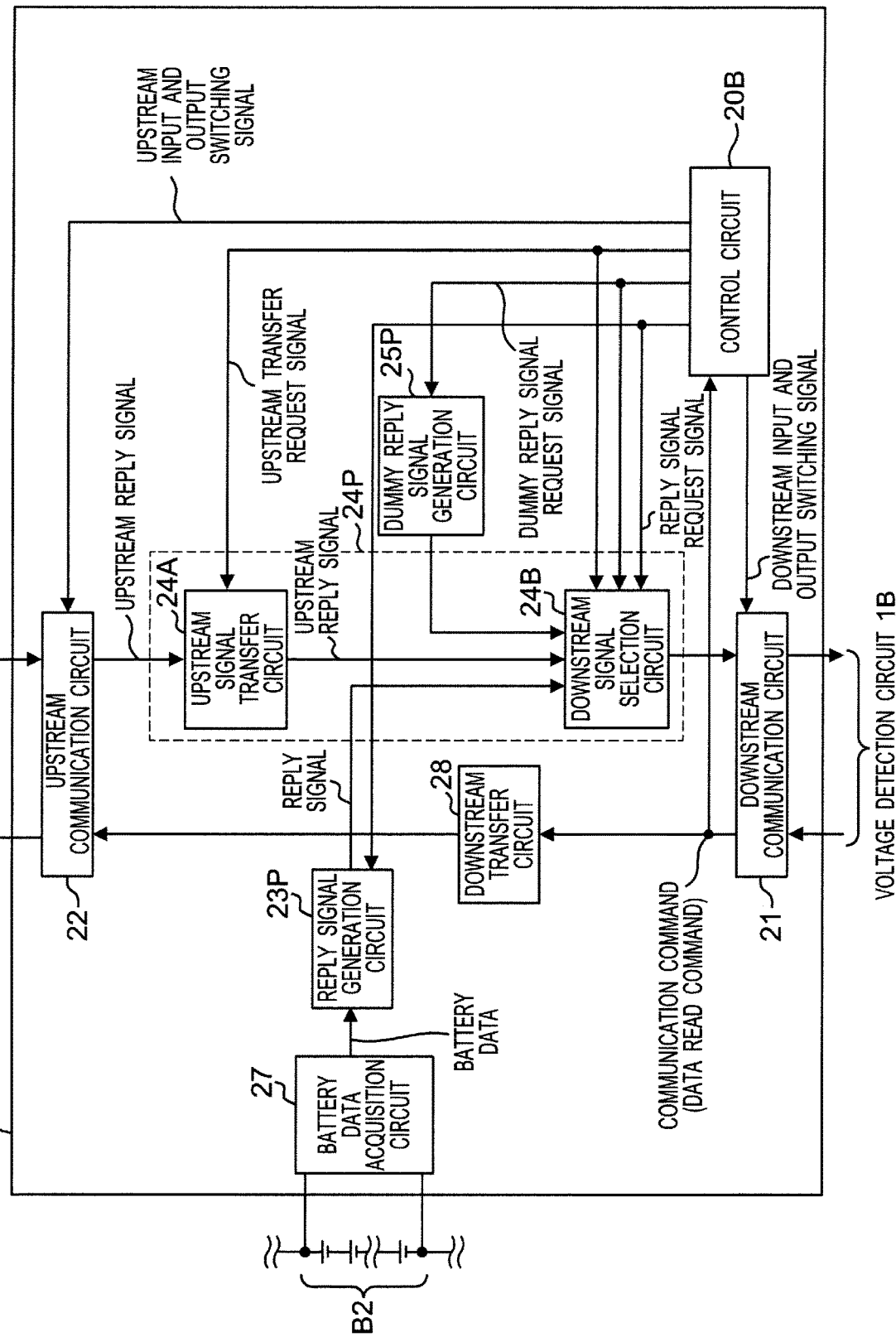
FIG. 6B is a block diagram showing a detailed configuration example of the voltage detection circuit 2B of FIG. 5.

FIG. 6B is a block diagram showing a detailed configuration example of the voltage detection circuit 2B of FIG. 5. Referring to FIG. 6B, the upstream transfer circuit 24P is configured to include an upstream signal transfer circuit 24A and a downstream signal selection circuit 24B. In this case, the downstream signal selection circuit 34B performs as follows:

(1) When receiving a reply signal request signal from the control circuit 20B, the downstream signal selection circuit 34B selects a reply signal from the reply signal generation circuit 23P, and outputs the selected signal to the downstream communication circuit 21.

(2) When receiving an upstream transfer request signal from the control circuit 20B, the downstream signal selection circuit 34B selects an upstream reply signal from the upstream signal transfer circuit 24A, and outputs the selected signal to the downstream communication circuit 21.

(3) When receiving a dummy reply signal request signal from the control circuit 20B, the downstream signal selection circuit 34B selects a dummy reply signal from the dummy reply signal generation circuit 25P, and outputs the selected signal to the downstream communication circuit 21.

Referring to FIG. 6B, the battery data acquisition circuit 27 measures the cell voltage of the cell B2, generates battery data including data of the cell voltage, and outputs the generated battery data to the reply signal generation circuit 23P. Each of the circuits 21 to 25P of the voltage detection circuit 2B operates in a manner similar to each of the circuits 11 to 15P of FIG. 6A.

Figure 6C:
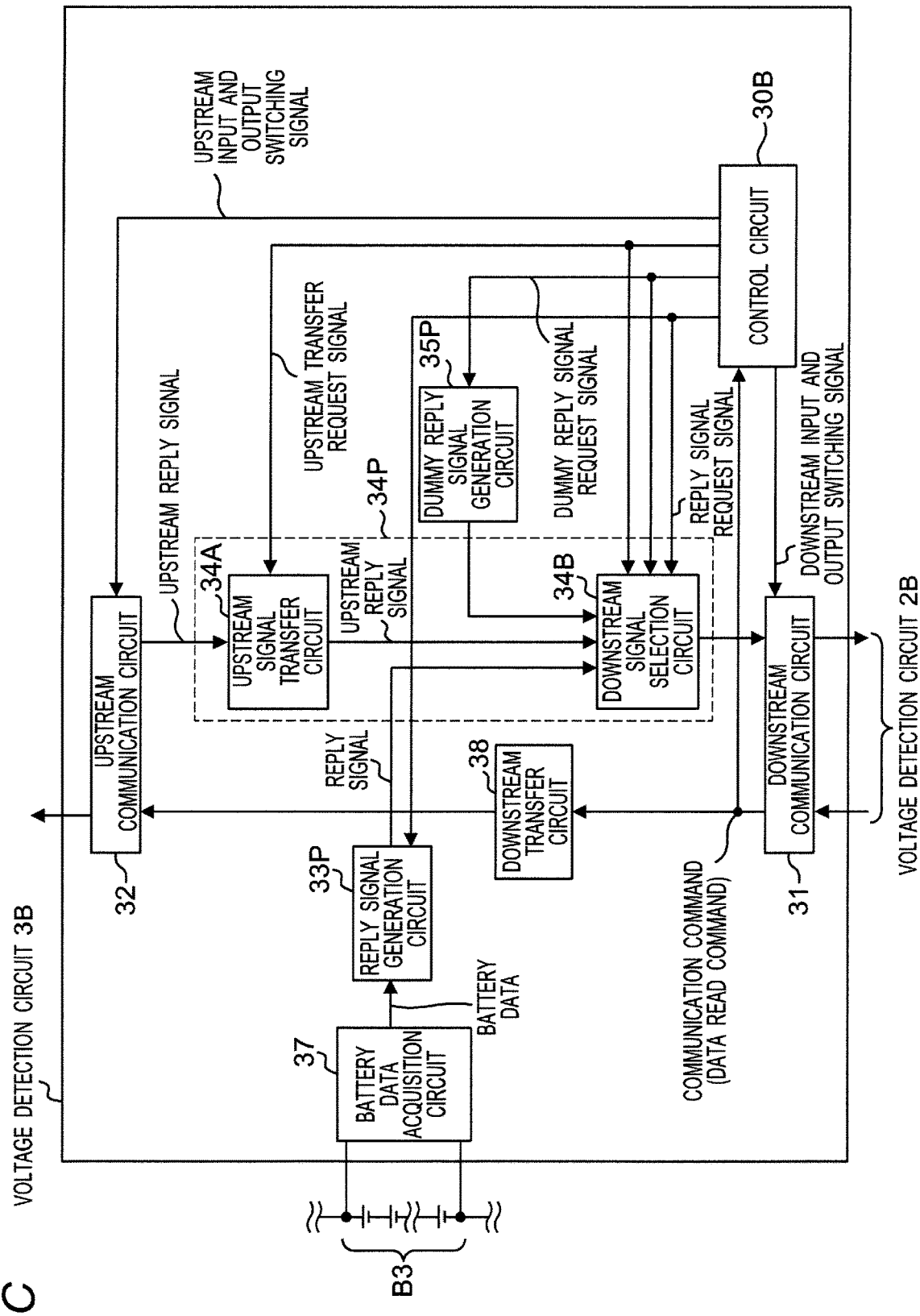
FIG. 6C is a block diagram showing a detailed configuration example of the voltage detection circuit 3B of FIG. 5.

FIG. 6C is a block diagram showing a detailed configuration example of the voltage detection circuit 3B of FIG. 5. Referring to FIG. 6C, the upstream transfer circuit 34P is configured to include an upstream signal transfer circuit 34A and a downstream signal selection circuit 34B. In this case, the downstream signal selection circuit 34B performs as follows:

(1) When receiving a reply signal request signal from the control circuit 30B, the downstream signal selection circuit 34B selects a reply signal from the reply signal generation circuit 33P, and outputs the selected signal to the downstream communication circuit 31.

(2) When receiving an upstream transfer request signal from the control circuit 30B, the downstream signal selection circuit 34B selects an upstream reply signal from the upstream signal transfer circuit 34A, and outputs the selected signal to the downstream communication circuit 31.

(3) When receiving a dummy reply signal request signal from the control circuit 30B, the downstream signal selection circuit 34B selects a dummy reply signal from the dummy reply signal generation circuit 35P, and outputs the selected signal to the downstream communication circuit 31.

Referring to FIG. 6C, the battery data acquisition circuit 37 measures the cell voltage of the cell B3, generates battery data including data of the cell voltage, and outputs the generated battery data to the reply signal generation circuit 33P. Each of the circuits 31 to 35P of the voltage detection circuit 3B operates in a manner similar to each of the circuits 11 to 15P of FIG. 6A.

Figure 7:
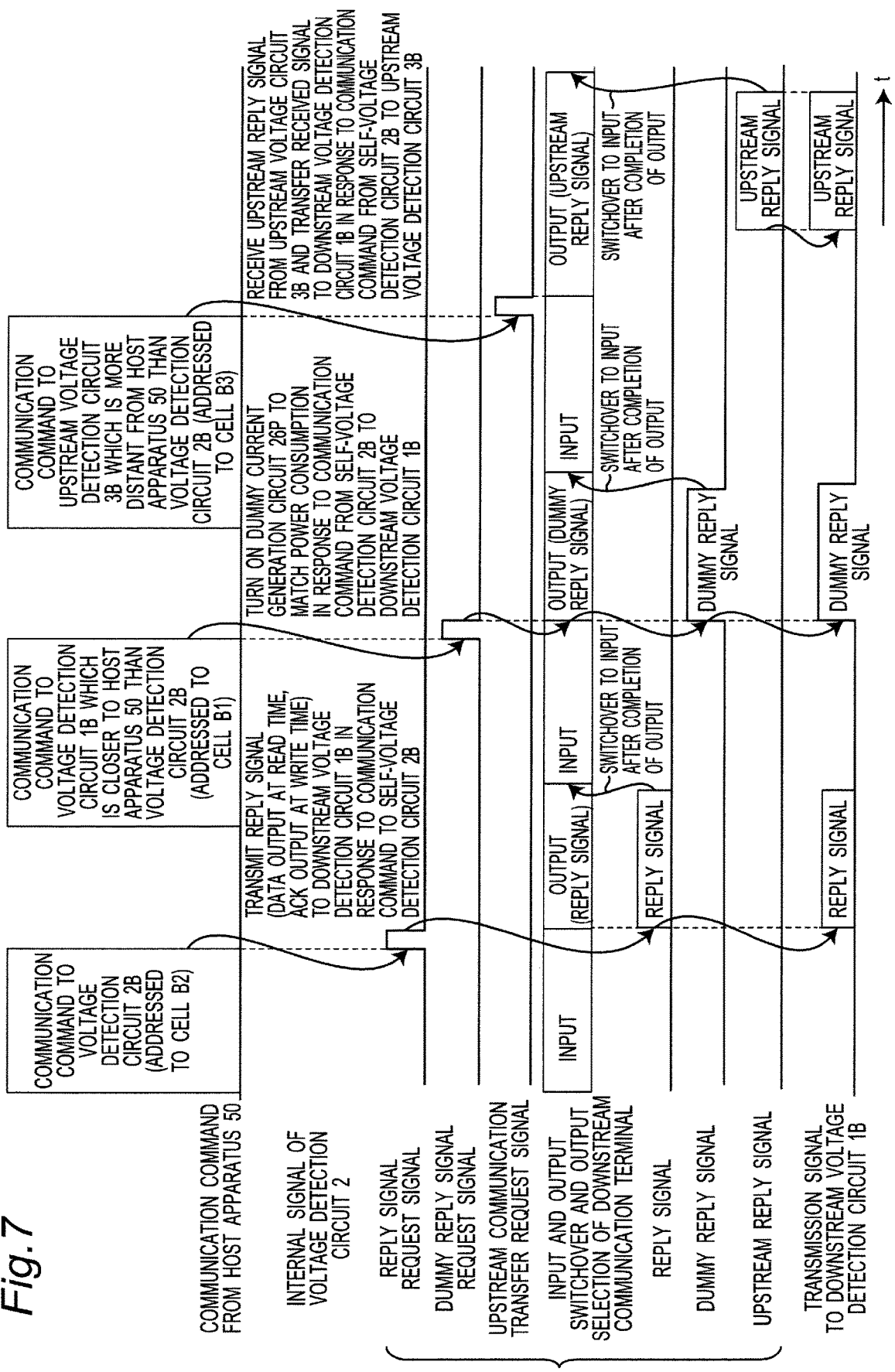
FIG. 7 is a timing chart showing an operation example of the assembled battery system 200B of FIG. 5.

FIG. 7 is a timing chart showing an operation example of the assembled battery system 200B of FIG. 5. With reference to FIG. 7, the operation of the voltage detection circuit 2B provided between the voltage detection circuit 1B and the voltage detection circuit 3B will be described below.

Referring to FIG. 7, upon receiving the communication command (addressed to the cell B2) from the host apparatus 50 to the voltage detection circuit 2B, the control circuit 20B of the voltage detection circuit 2B outputs the downstream input and output switching signal (output instruction) to the downstream communication circuit 21, and the downstream communication circuit 21 is switched over from an input mode to an output mode. In addition, by outputting the reply signal request signal to the reply signal generation circuit 23P and the downstream signal selection circuit 24B, the control circuit 20B outputs a reply signal containing the battery data on the cell B2, following an ACK (Acknowledgement) signal, from the reply signal generation circuit 23P to the host apparatus 50 via the downstream signal selection circuit 24B, the downstream communication circuit 21, and the voltage detection circuit 1B. After the transmission of the reply signal, the downstream communication circuit 21 is switched over from the output mode to the input mode based on the downstream input and output switching signal (input instruction) from the control circuit 20B.

Subsequently, upon receiving the communication command (addressed to the cell B1) from the host apparatus 50 to the voltage detection circuit 1B located at the side of downstream of the voltage detection circuit 2, the control circuit 20B of the voltage detection circuit 2B outputs the downstream input and output switching signal (output instruction) to the downstream communication circuit 21, and the downstream communication circuit 21 is switched over from the input mode to the output mode. In addition, by outputting the dummy reply signal request signal to the dummy reply signal generation circuit 25P and the downstream signal selection circuit 24B, the control circuit 20B transmits a dummy reply signal from the dummy reply signal generation circuit 25P to the host apparatus 50 via the downstream signal selection circuit 24B, the downstream communication circuit 21, and the voltage detection circuit 1B. After the transmission of the reply signal, the downstream communication circuit 21 is switched over from the output mode to the input mode based on the downstream input and output switching signal (input instruction) from the control circuit 20B.

Further, upon receiving the communication command (addressed to the cell B3) from the host apparatus 50 to the voltage detection circuit 3B located at the side of upstream of the voltage detection circuit 2, the control circuit 20B of the voltage detection circuit 2B outputs the downstream input and output switching signal (output instruction) to the downstream communication circuit 21, and the downstream communication circuit 21 is switched over from the input mode to the output mode. In addition, by outputting the upstream transfer request signal to the upstream signal transfer circuit 24A and the downstream signal selection circuit 24B, the control circuit 20B transmits an upstream reply signal, which is received by the upstream communication circuit 22, from the upstream signal transfer circuit 24A to the host apparatus 50 via the downstream signal selection circuit 24B, the downstream communication circuit 21, and the voltage detection circuit 1B. After the transmission of the upstream reply signal, the downstream communication circuit 21 is switched over from the output mode to the input mode based on the downstream input and output switching signal (input instruction) from the control circuit 20B.

As described above, according to the present embodiment, at the time of the battery data readout from any of the voltage detection circuits 1B, 2B and 3B, the voltage detection circuit 1B, 2B, or 3B selectively operates any one of the reply signal generation circuit 13P, 23P, or 33P, the upstream transfer circuit 14P, 24P, or 34P, and the dummy reply signal generation circuit 15P, 25P, or 35P. As a result, it is possible to reduce the difference in current consumption related to data communication among the voltage detection circuits 1B, 2B and 3B, equalize the current consumption or the power consumption of each of the voltage detection circuits 1B, 2B and 3B that operates with each of the cell voltages of the cells B1, B2 and B3, and make each of the cell voltages uniform.

In the third embodiment, the communication speed of the dummy reply signal generated by the dummy reply signal generation circuit 15P is set to be higher than the communication speed of the reply signal generated by the reply signal generation circuit 13P, for example. Thus, as described with reference to FIG. 3, it is possible to prevent interference with the communication command from the host apparatus 50 and the response signal thereto, which are transmitted following the reply signal.

In the third embodiment, the upstream communication circuit 32 of the voltage detection circuit 3B that detects the cell voltage of the most upstream cell selected from the plurality of cells does not receive the dummy reply signal from the voltage detection circuit located at the side of upstream, since there is no voltage detection circuit located at the side of upstream.

In the third embodiment, the battery data acquisition circuit 17, 27 and 37 measure the cell voltages of the cells B1, B2 and B3, respectively, and generate battery data including data of cell voltages to the reply signal generation circuit 13P, 23P and 33P. The reply signal generation circuit 13P, 23P and 33P generate and transmits a reply signal containing battery data on the cells B1, B2 and B3, respectively. However, the present invention is not limited to this, and the battery data includes the following data instead of the battery data containing data of the cell voltages, or includes the following data in addition to the battery data containing data of the cell voltages. The battery data may include detection data or data stored in a register such as an abnormality detection, an abnormality detection voltage, and an operation control set value at the inside of the voltage detection circuits 1B, 2B and 3B, each of which is configured by an Integrated Circuit (IC) etc. This is the same in the following embodiments.

Fourth Embodiment

Figure 8:
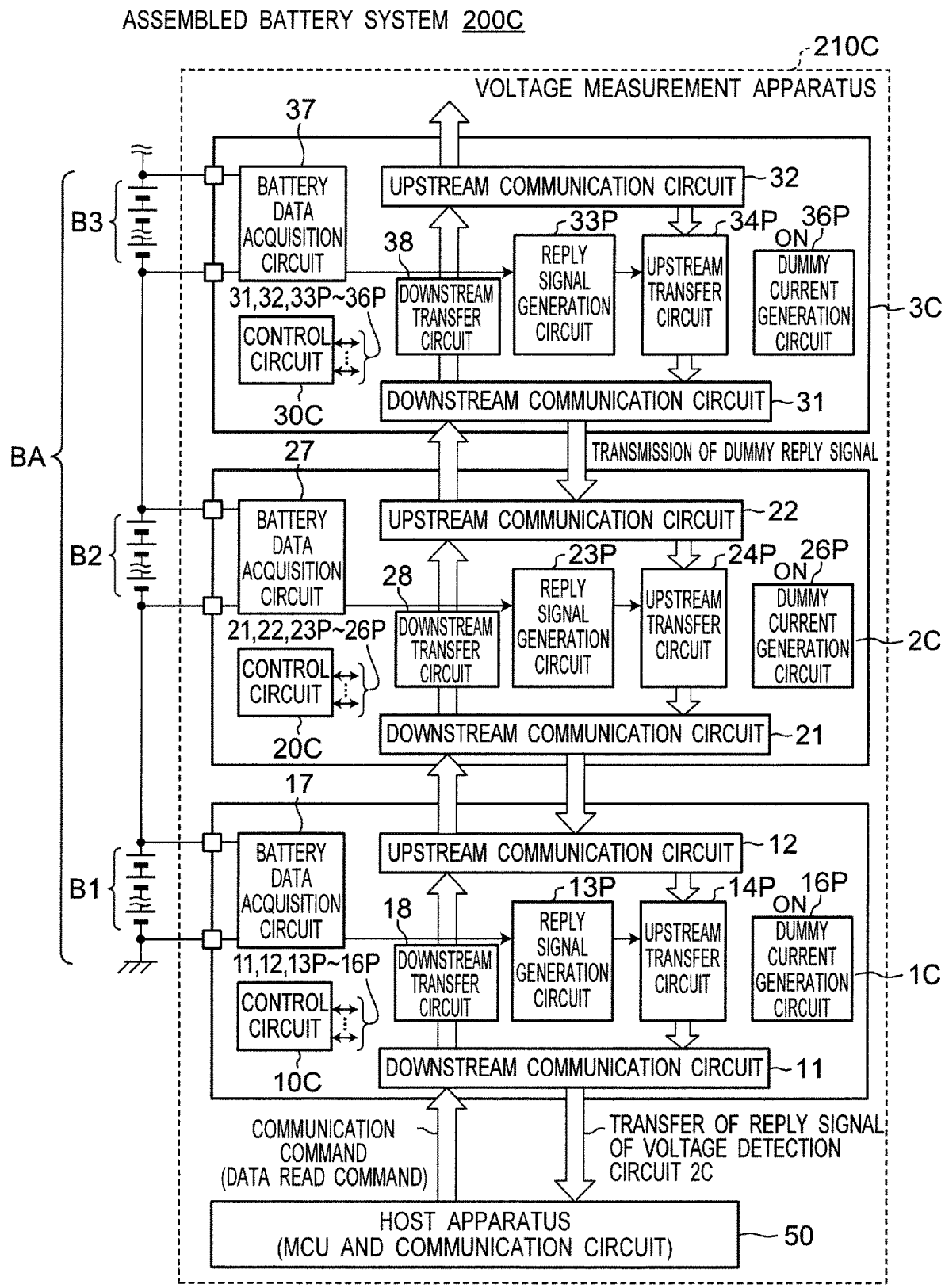
FIG. 8 is a block diagram showing a configuration example of voltage detection circuits 1C, 2C and 3C, a voltage measurement apparatus 210C, and an assembled battery system 200C according to a fourth embodiment of the present invention.

FIG. 8 is a block diagram showing a configuration example of voltage detection circuits 1C, 2C and 3C, a voltage measurement apparatus 210C, and an assembled battery system 200C according to a fourth embodiment of the present invention. Referring to FIG. 8, the assembled battery system 200C is a detailed embodiment making the assembled battery system 200A of FIG. 4 more specific, and as compared to the assembled battery system 200A of FIG. 4, the voltage detection circuits 1C, 2C and 3C are provided in place of the voltage detection circuits 1A, 2A and 3A, respectively.

Referring to FIG. 8, the assembled battery system 200C includes an assembled battery BA configured by connecting cells B1, B2 and B3 in series and the voltage measurement apparatus 210C. In the voltage measurement apparatus 210C, a host apparatus 50 and three voltage detection circuits 1C, 2C and 3C are connected in series in a daisy chain via, for example, a wired line.

Figure 9A:
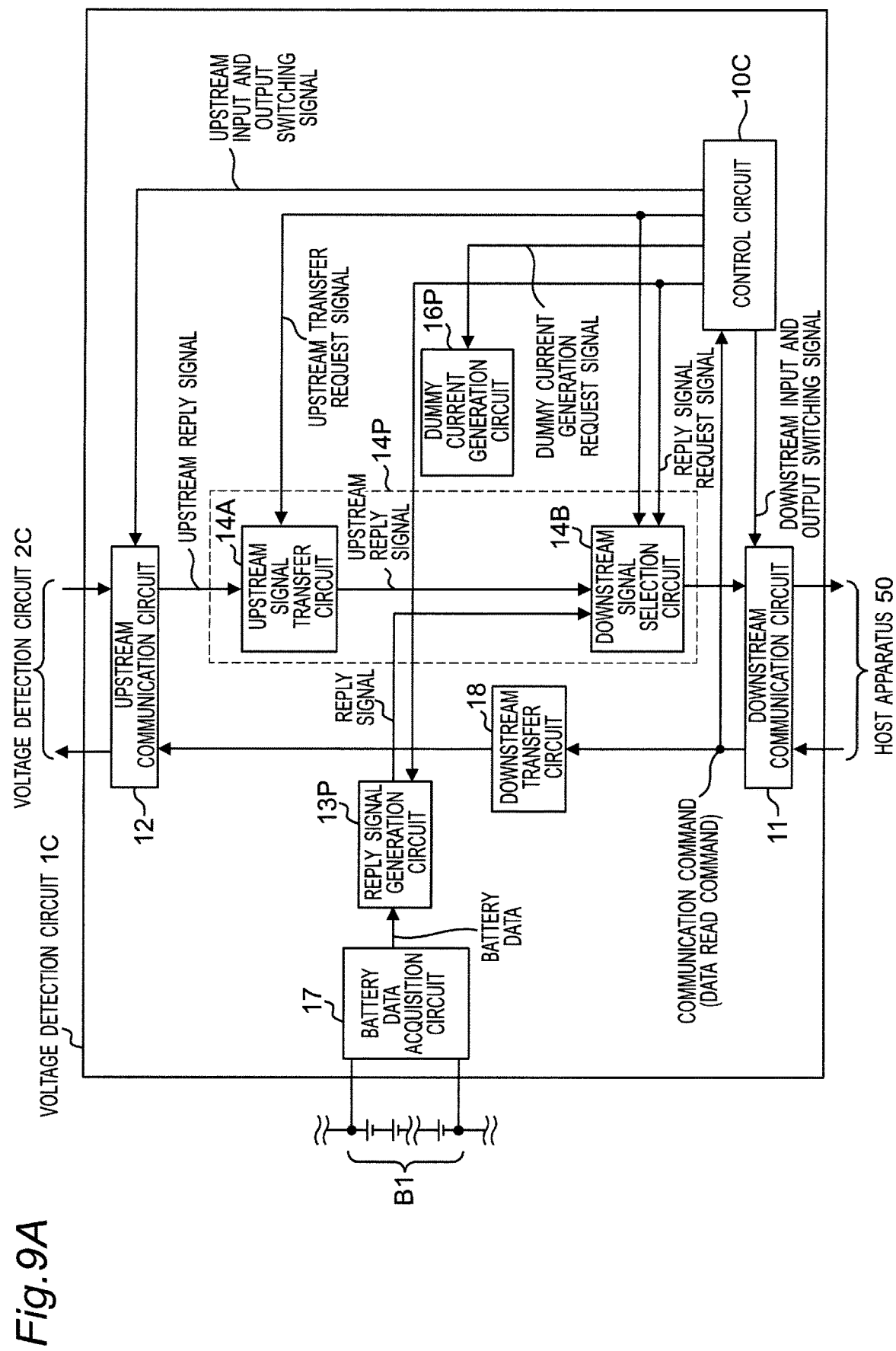
FIG. 9A is a block diagram showing a detailed configuration example of the voltage detection circuit 1C of FIG. 8.
Figure 9B:
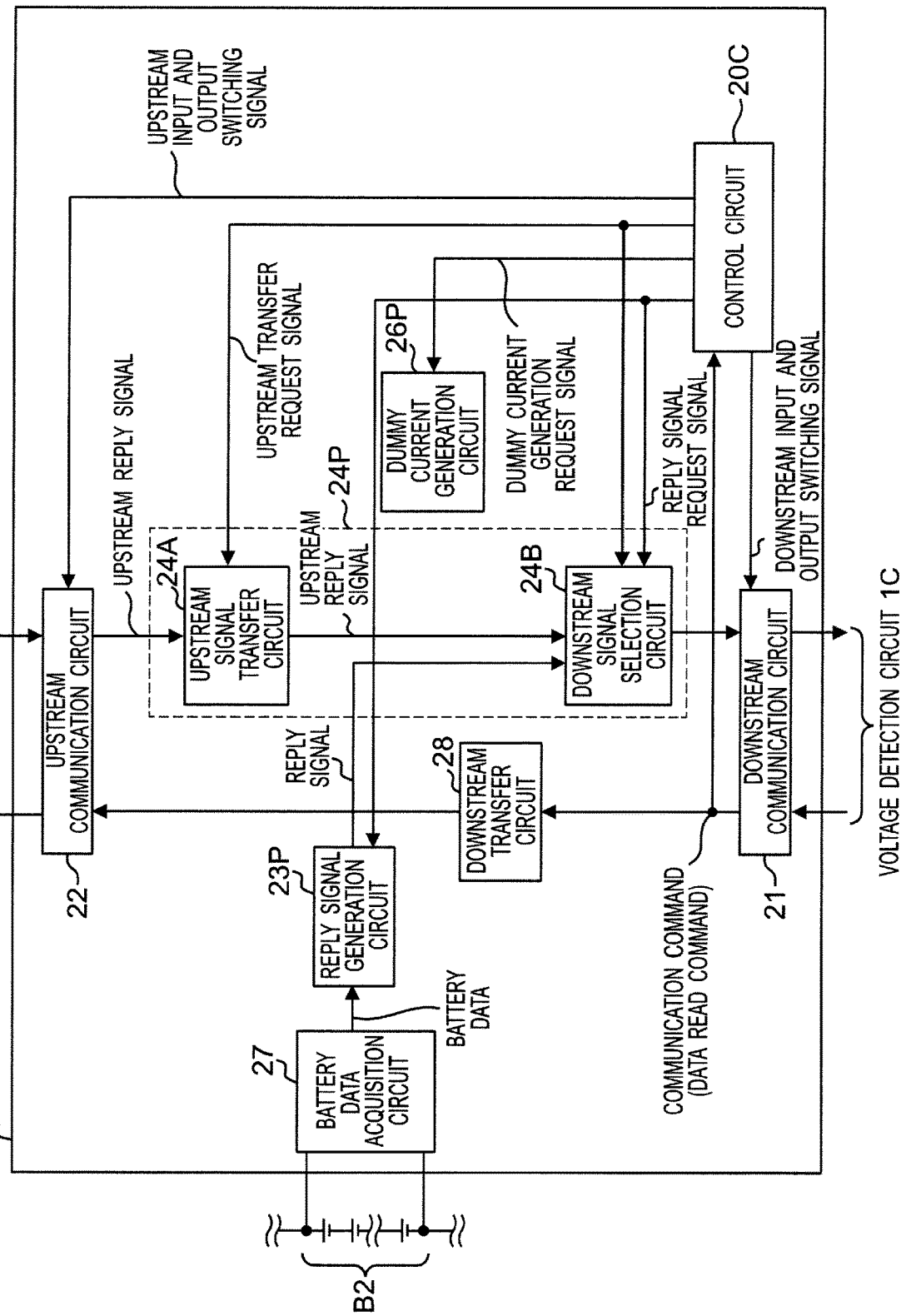
FIG. 9B is a block diagram showing a detailed configuration example of the voltage detection circuit 2C of FIG. 8.
Figure 9C:
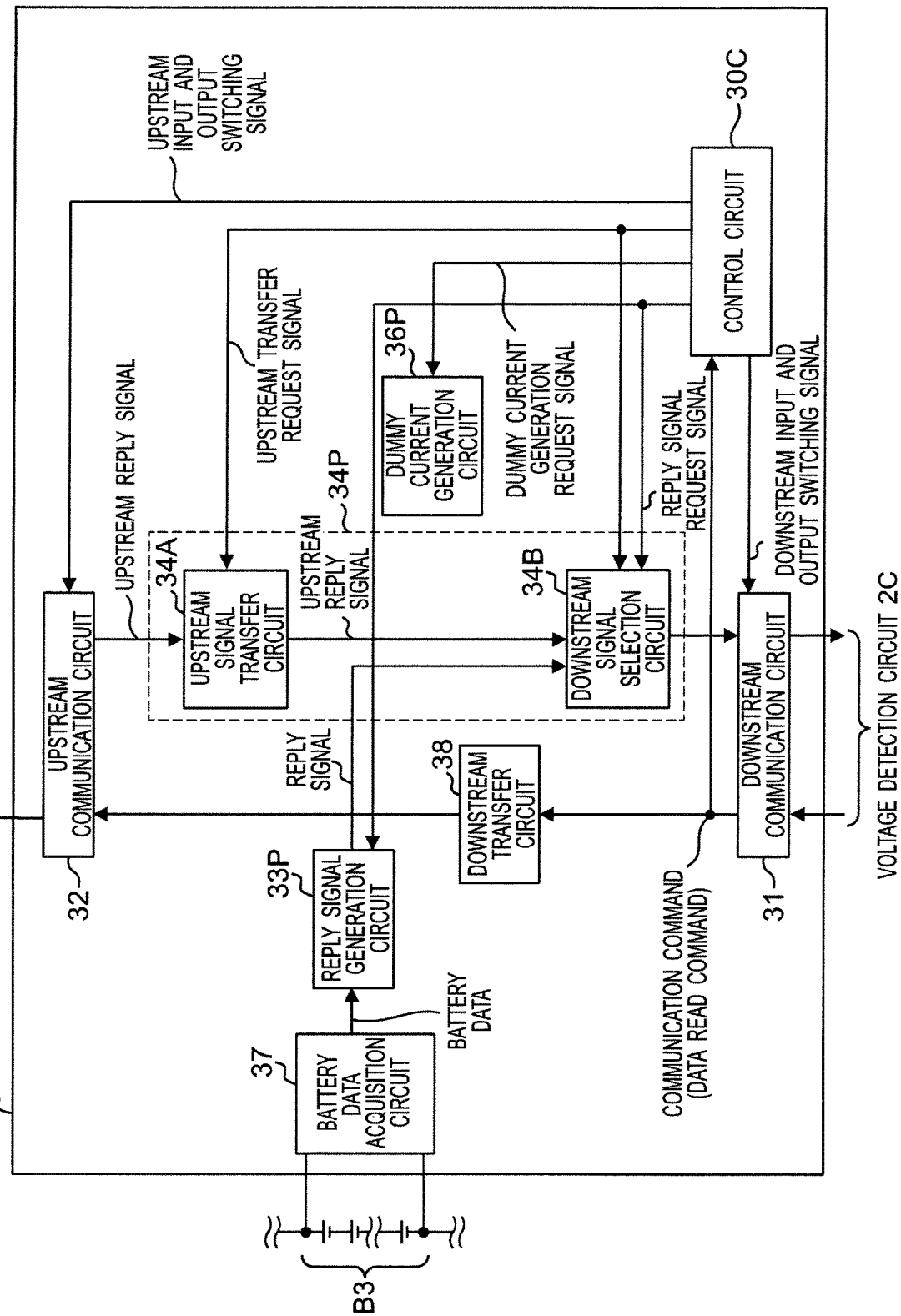
FIG. 9C is a block diagram showing a detailed configuration example of the voltage detection circuit 3C of FIG. 8.

FIG. 9A is a block diagram showing a detailed configuration example of the voltage detection circuit 1C of FIG. 8. In addition, FIG. 9B is a block diagram showing a detailed configuration example of the voltage detection circuit 2C of FIG. 8. Further, FIG. 9C is a block diagram showing a detailed configuration example of the voltage detection circuit 3C of FIG. 8.

As compared to the voltage detection circuit 1B of FIG. 5, the voltage detection circuit 1C of FIG. 9A is characterized by the following steps:

(1) including a dummy current generation circuit 16P in place of the dummy reply signal generation circuit 15P; and (2) including a control circuit 10C in place of the control circuit 10B.

The dummy current generation circuit 16P generates a predetermined dummy current based on a dummy current generation request signal from the control circuit 10B. It is noted that the dummy current generation request signal is output only from the control circuit 10B to the dummy current generation circuit 16P.

As compared to the voltage detection circuit 2B of FIG. 5, the voltage detection circuit 2C of FIG. 9B is characterized by the following steps:

(1) including a dummy current generation circuit 26P in place of the dummy reply signal generation circuit 25P; and (2) including a control circuit 20C in place of the control circuit 20B.

The dummy current generation circuit 26P generates a predetermined dummy current based on a dummy current generation request signal from the control circuit 20B. It is noted that the dummy current generation request signal is output only from the control circuit 20B to the dummy current generation circuit 26P.

As compared to the voltage detection circuit 1B of FIG. 5, the voltage detection circuit 3C of FIG. 9C is characterized by the following steps:

(1) including a dummy current generation circuit 36P in place of the dummy reply signal generation circuit 35P; and (2) including a control circuit 30C in place of the control circuit 30B.

The dummy current generation circuit 36P generates a predetermined dummy current based on a dummy current generation request signal from the control circuit 30B. It is noted that the dummy current generation request signal is output only from the control circuit 30B to the dummy current generation circuit 36P.

Figure 10:
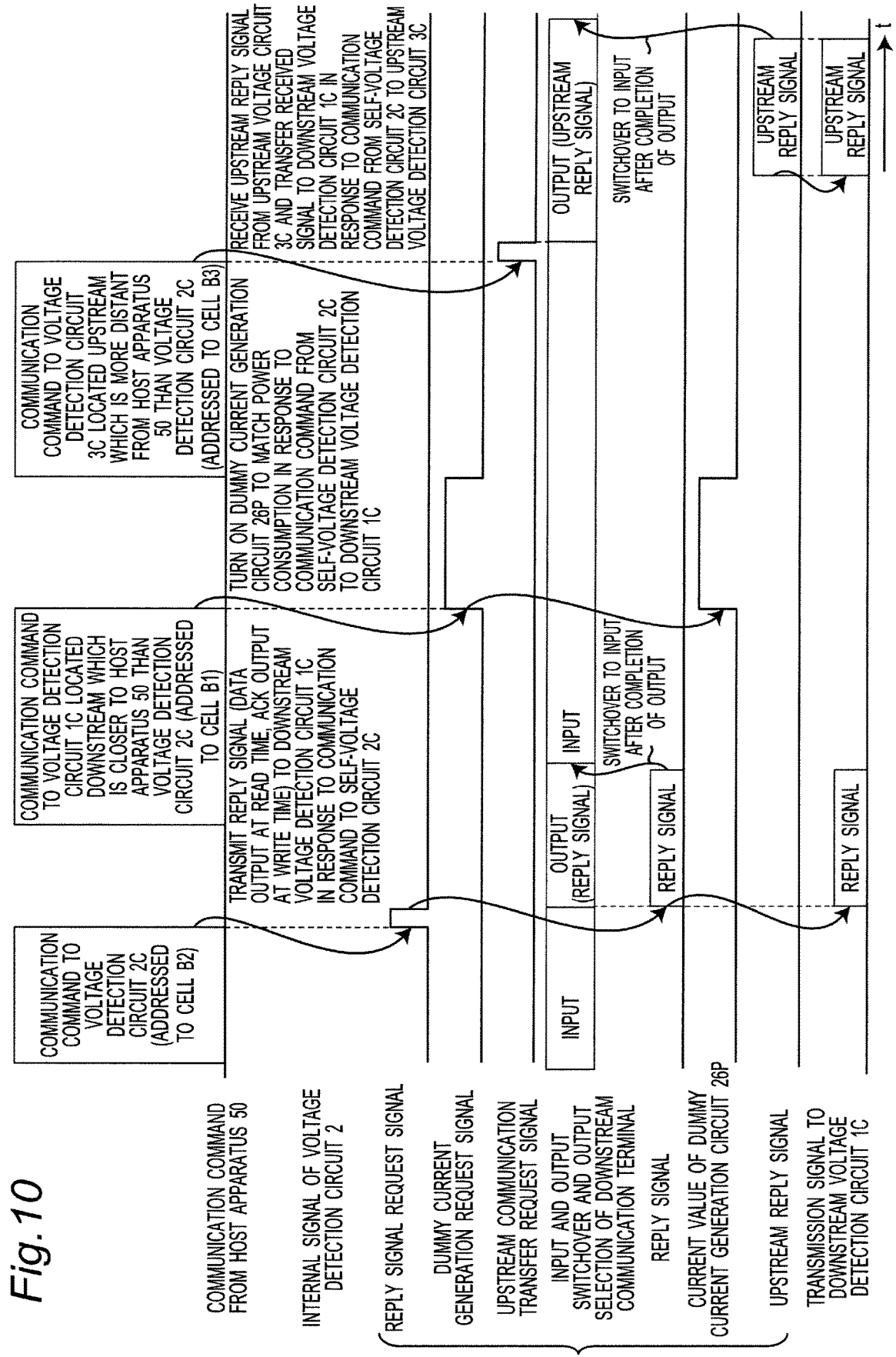
FIG. 10 is a timing chart showing an operation example of the assembled battery system 200C of FIG. 8.

FIG. 10 is a timing chart showing an operation example of the assembled battery system 200C of FIG. 8. With reference to FIG. 10, the operation of the voltage detection circuit 2C provided between the voltage detection circuit 1C and the voltage detection circuit 3C will be described below.

Referring to FIG. 10, upon receiving the communication command (addressed to the cell B2) from the host apparatus 50 to the voltage detection circuit 2C, the control circuit 20C of the voltage detection circuit 2C outputs the downstream input and output switching signal (output instruction) to the downstream communication circuit 21, and the downstream communication circuit 21 is switched over from an input mode to an output mode. In addition, by outputting the reply signal request signal to the reply signal generation circuit 23P and the downstream signal selection circuit 24B, the control circuit 20C outputs a reply signal containing the battery data on the cell B2, following an ACK signal, from the reply signal generation circuit 23P to the host apparatus 50 via the downstream signal selection circuit 24B, the downstream communication circuit 21, and the voltage detection circuit 1C. After the transmission of the reply signal, the downstream communication circuit 21 is switched over from the output mode to the input mode based on the downstream input and output switching signal (input instruction) from the control circuit 20C.

Next, upon receiving the communication command (addressed to the cell B1) from the host apparatus 50 to the voltage detection circuit 1C located at the side of downstream of the voltage detection circuit 2, the control circuit 20C of the voltage detection circuit 2C outputs the dummy current generation request signal to the dummy current generation circuit 26P so that the dummy current generation circuit 26P generates a predetermined dummy current.

Further, upon receiving the communication command (addressed to the cell B3) from the host apparatus 50 to the voltage detection circuit 3C located at the side of upstream of the voltage detection circuit 2, the control circuit 20C of the voltage detection circuit 2C outputs the downstream input and output switching signal (output instruction) to the downstream communication circuit 21, and the downstream communication circuit 21 is switched over from the input mode to the output mode. In addition, by outputting the upstream transfer request signal to the upstream signal transfer circuit 24A and the downstream signal selection circuit 24B, the control circuit 20C transmits an upstream reply signal, which is received by the upstream communication circuit 22, from the upstream signal transfer circuit 24A to the host apparatus 50 via the downstream signal selection circuit 24B, the downstream communication circuit 21, and the voltage detection circuit 1C. After the transmission of the upstream reply signal, the downstream communication circuit 21 is switched from the output mode to the input mode based on the downstream input and output switching signal (input instruction) from the control circuit 20C.

As described above, according to the present embodiment, at the time of the battery data readout from any of the voltage detection circuits 10, 2C and 3C, the voltage detection circuit 10, 2C, or 3C selectively operates any one of the reply signal generation circuit 13P, 23P, or 33P, the upstream transfer circuit 14P, 24P, or 34P, and the dummy current generation circuit 16P, 26P, or 36P. As a result, it is possible to reduce the difference in current consumption related to data communication among the voltage detection circuits 1C, 2C and 3C, equalize the current consumption or the power consumption of each of the voltage detection circuits 10, 2C and 3C that operates with each of the cell voltages of the cells B1, B2 and B3, and make each of the cell voltages uniform.

The dummy reply signal generation circuits 15P, 25P and 35P according to the third embodiment consume a predetermined dummy current by generating the dummy reply signal. The dummy current generation circuits 16P, 26P and 36P according to the fourth embodiment consume a predetermined dummy current by generating the dummy current. Therefore, both the dummy reply signal generation circuits 15P, 25P and 35P and the dummy current generation circuits 16P, 26P and 36P can be regarded as the dummy current consumption circuit. In this case, for example, the power consumption of the upstream transfer circuits 14P, 24P and 34P, the power consumption of the reply signal generation circuits 13P, 23P and 33P, the power consumption of the dummy reply signal generation circuits 15P, 25P and 35P, and the power consumption of the dummy current generation circuits 16P, 26P and 36P are the same as each other.

First Modified Embodiment

Figure 11A:
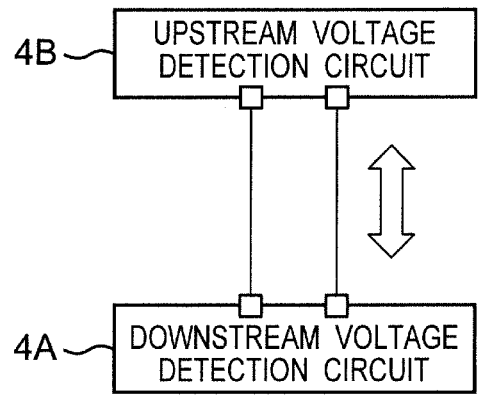
FIG. 11A is a block diagram showing a scheme example 1 of a communication line between an upstream voltage detection circuit 4A and a downstream voltage detection circuit 4B according to a first modified embodiment.
Figure 11B:
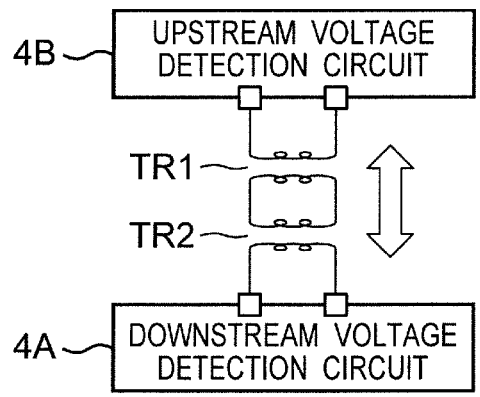
FIG. 11B is a block diagram showing a scheme example 2 of the communication line between the upstream voltage detection circuit 4A and the downstream voltage detection circuit 4B according to the first modified embodiment.
Figure 11C:
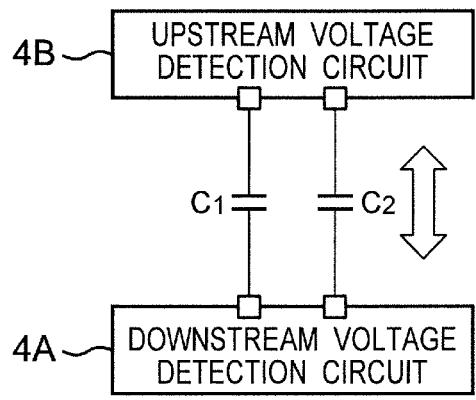
FIG. 11C is a block diagram showing a scheme example 3 of the communication line between the upstream voltage detection circuit 4A and the downstream voltage detection circuit 4B according to the first modified embodiment.

FIGS. 11A to 11C are block diagrams showing scheme examples of a communication line between an upstream voltage detection circuit 4A and a downstream voltage detection circuit 4B (corresponding to two adjacent voltage detection circuits selected from the voltage detection circuits (1, 2 and 3), (1A, 2A and 3A), (1B, 2B and 3B), (1C, 2C and 3C) of the first to fourth embodiments). FIGS. 11A to 11C show configuration examples of a daisy-chain connection communication scheme between the voltage detection circuits.

(1) FIG. 11A: a direct connection scheme; signals are communicated by being directly connected through communication cables.

(2) FIG. 11B: a transformer scheme; insulation communication is performed in which signals are transmitted through transformer elements TR1 and TR2.

(3) FIG. 11C: a capacitive scheme; insulation communication is performed in which signals are transmitted through capacitive elements of capacitors C1 and C2.

Second Modified Embodiment

Hereinafter, a description will be given of summaries of voltage detection circuits according to first to eighth aspects of a second modified embodiment, voltage measurement apparatuses according to ninth to sixteenth aspects of the second modified embodiment, and assembled battery systems according to seventeenth to twenty-fourth aspects of the second modified embodiment.

A voltage detection circuit according to the first aspect is characterized in that, the voltage detection circuit is provided for measuring a cell voltage in an assembled battery configured by connecting a plurality of cells in series. The voltage detection circuit includes:

a downstream communication circuit having a function of receiving a communication from a host apparatus side and a function of transmitting communication to the host apparatus side;

an upstream communication circuit having a function of transferring the communication from the host apparatus side to other voltage detection circuit and a function of receiving communication from the other voltage detection circuit; and a control circuit that selectively switches over three circuits which are a data transmission circuit, a dummy data transmission circuit, and a transfer circuit for data received from the upstream communication circuit based on the communication received by the downstream communication circuit from the host apparatus side, and controls the downstream communication circuit and the upstream communication circuit.

A voltage detection circuit according to the second aspect is characterized in that, in the voltage detection circuit according to the first aspect, the control circuit selects the data transmission circuit when the communication received from the host apparatus side is directed to the self-voltage detection circuit;

the control circuit selects the dummy data transmission circuit when the communication received from the host apparatus side is directed to a voltage detection circuit closer to the host apparatus side than the self-voltage detection circuit, and the control circuit selects the transfer circuit for data received from the upstream communication circuit when the communication received from the host apparatus side is directed to a voltage detection circuit more distant from the host apparatus side than the self-voltage detection circuit.

A voltage detection circuit according to the third aspect is characterized in that, in the voltage detection circuit according to the first aspect, when the communication received from the host apparatus side is directed to the self-voltage detection circuit or the voltage detection circuit closer to the host apparatus side than the self-voltage detection circuit, the upstream communication circuit does not receive the data.

A voltage detection circuit according to the fourth aspect is characterized in that, in the voltage detection circuit according to any one of the first to third aspects, the dummy data transmission circuit performs communication at a communication speed higher than that of the data transmission circuit.

A voltage detection circuit according to the fifth aspect is characterized in that, in the voltage detection circuit according to the fourth aspect, the dummy data transmission circuit sets current consumption during communication to have the same power consumption as that of the data transmission circuit.

A voltage detection circuit according to the sixth aspect is a voltage detection circuit for measuring a cell voltage in an assembled battery configured by connecting a plurality of cells in series. The voltage detection circuit includes:

a downstream communication circuit having a function of receiving communication from a host apparatus side and a function of transmitting communication to the host apparatus side;

an upstream communication circuit having a function of transferring the communication from the host apparatus side to other voltage detection circuit and a function of receiving communication from the other voltage detection circuit; and a control circuit that selectively switches over three circuits, which are a data transmission circuit, a dummy current circuit, and a transfer circuit for data received from the upstream communication circuit based on the communication received by the downstream communication circuit from the host apparatus side, and controls the downstream communication circuit and the upstream communication circuit.

A voltage detection circuit according to the seventh aspect is characterized in that, in the voltage detection circuit according to the sixth aspect, the control circuit selects the data transmission circuit when the communication received from the host apparatus side is directed to the self-voltage detection circuit, the control circuit turns on the dummy current circuit when the communication received from the host apparatus side is directed to a voltage detection circuit closer to the host apparatus side than the self-voltage detection circuit, and the control circuit selects the transfer circuit for data received from the upstream communication circuit when the communication received from the host apparatus side is directed to a voltage detection circuit more distant from the host apparatus side than the self-voltage detection circuit.

A voltage detection circuit according to the eighth aspect is characterized in that, in the voltage detection circuit according to the sixth or seventh aspect, the dummy current circuit sets a current value to have the same power consumption as that of the data transmission circuit.

A voltage measurement apparatus according to the ninth aspect is characterized in that, the voltage measurement apparatus includes a plurality of voltage detection circuits; and a host apparatus. The voltage measurement apparatus is configured to measure a cell voltage in an assembled battery configured by connecting a plurality of cells in series. The voltage measurement apparatus is configured by connecting the plurality of voltage detection circuits in daisy chain, and each of the voltage detection circuits measures a cell voltage in the assembled battery configured by connecting the plurality of cells in series. Each of the voltage detection circuits includes:

a downstream communication circuit having a function of receiving communication from a host apparatus side and a function of transmitting communication to the host apparatus side;

an upstream communication circuit having a function of transferring the communication from the host apparatus side to other voltage detection circuit and a function of receiving communication from the other voltage detection circuit; and a control circuit that selectively switches over three circuits which are a data transmission circuit, a dummy data transmission circuit, and a transfer circuit for data received from the upstream communication circuit based on the communication received by the downstream communication circuit from the host apparatus side, and controls the downstream communication circuit and the upstream communication circuit.

A voltage measurement apparatus according to the tenth aspect is characterized in that, in the voltage measurement apparatus according to the ninth aspect, the control circuit selects the data transmission circuit when the communication received from the host apparatus side is directed to the self-voltage detection circuit, the control circuit selects the dummy data transmission circuit when the communication received from the host apparatus side is directed to a voltage detection circuit closer to the host apparatus side than the self-voltage detection circuit, and the control circuit selects the transfer circuit for data received from the upstream communication circuit when the communication received from the host apparatus side is directed to a voltage detection circuit more distant from the host apparatus side than the self-voltage detection circuit.

A voltage measurement apparatus according to the eleventh aspect is characterized in that, in the voltage measurement apparatus according to the ninth or tenth aspect, when the communication received from the host apparatus side is directed to the self-voltage detection circuit or the voltage detection circuit closer to the host apparatus side than the self-voltage detection circuit, the upstream communication circuit does not receive the data.

A voltage measurement apparatus according to the twelfth aspect is characterized in that, in the voltage measurement apparatus according to any one of the ninth to eleventh aspects, the dummy data transmission circuit performs communication at a communication speed higher than that of the data transmission circuit.

A voltage measurement apparatus according to the thirteenth aspect is characterized in that, in the voltage measurement apparatus according to the twelfth aspect, the dummy data transmission circuit sets current consumption during communication to have the same power consumption as that of the data transmission circuit.

A voltage measurement apparatus according to the fourteenth aspect is characterized in that, the voltage measurement apparatus includes a plurality of voltage detection circuits; and a host apparatus. The voltage measurement apparatus is provided to measure a cell voltage in an assembled battery configured by connecting a plurality of cells in series. The voltage measurement apparatus is configured by connecting the plurality of voltage detection circuits in daisy chain. Each of the voltage detection circuits measures a cell voltage in the assembled battery configured by connecting the plurality of cells in series, and each of the voltage detection circuits includes:

a downstream communication circuit having a function of receiving communication from a host apparatus side and a function of transmitting communication to the host apparatus side;

an upstream communication circuit having a function of transferring the communication from the host apparatus side to other voltage detection circuit and a function of receiving communication from the other voltage detection circuit; and a control circuit that selectively switches over three circuits which are a data transmission circuit, a dummy current circuit, and a transfer circuit for data received from the upstream communication circuit based on the communication received by the downstream communication circuit from the host apparatus side, and controls the downstream communication circuit and the upstream communication circuit.

A voltage measurement apparatus according to the fifteenth aspect is characterized in that, in the voltage measurement apparatus according to the fourteenth aspect, the control circuit selects the data transmission circuit when the communication received from the host apparatus side is directed to the self-voltage detection circuit, the control circuit turns on the dummy current circuit when the communication received from the host apparatus side is directed to a voltage detection circuit closer to the host apparatus side than the self-voltage detection circuit, and the control circuit selects the transfer circuit for data received from the upstream communication circuit when the communication received from the host apparatus side is directed to a voltage detection circuit more distant from the host apparatus side than the self-voltage detection circuit.

A voltage measurement apparatus according to the sixteenth aspect is characterized in that, in the voltage measurement apparatus according to the fourteenth or fifteenth aspect, the dummy current circuit sets a current value to have the same power consumption as that of the data transmission circuit.

An assembled battery system according to the seventeenth aspect is characterized in that, the assembled battery system includes: a voltage measurement apparatus that includes a plurality of voltage detection circuits and a host apparatus; and an assembled battery. The assembled battery system is provided to measure a cell voltage in an assembled battery configured by connecting a plurality of cells in series. The voltage measurement apparatus is configured by connecting the plurality of voltage detection circuits in daisy chain. Each of the voltage detection circuits measures a cell voltage in the assembled battery configured by connecting the plurality of cells in series, and each of the voltage detection circuits includes:

a downstream communication circuit having a function of receiving communication from a host apparatus side and a function of transmitting communication to the host apparatus side;

an upstream communication circuit having a function of transferring the communication from the host apparatus side to other voltage detection circuit and a function of receiving communication from the other voltage detection circuit; and a control circuit that selectively switches over three circuits which are a data transmission circuit, a dummy data transmission circuit, and a transfer circuit for data received from the upstream communication circuit based on the communication received by the downstream communication circuit from the host apparatus side, and controls the downstream communication circuit and the upstream communication circuit.

An assembled battery system according to the eighteenth aspect is characterized in that, in the assembled battery system according to the seventeenth aspect, the control circuit selects the data transmission circuit when the communication received from the host apparatus side is directed to the self-voltage detection circuit, the control circuit selects the dummy data transmission circuit when the communication received from the host apparatus side is directed to a voltage detection circuit closer to the host apparatus side than the self-voltage detection circuit, and the control circuit selects the transfer circuit for data received from the upstream communication circuit when the communication received from the host apparatus side is directed to a voltage detection circuit more distant from the host apparatus side than the self-voltage detection circuit.

An assembled battery system according to the nineteenth aspect is characterized in that, in the assembled battery system according to the seventeenth or eighteenth aspect, when the communication received from the host apparatus side is directed to the self-voltage detection circuit or the voltage detection circuit closer to the host apparatus side than the self-voltage detection circuit, the upstream communication circuit does not receive the data.

An assembled battery system according to the twentieth aspect is characterized in that, in the assembled battery system according to any one of the seventeenth to nineteenth aspects, the dummy data transmission circuit performs communication at a communication speed higher than that of the data transmission circuit.

An assembled battery system according to the twenty-first aspect is characterized in that, in the assembled battery system according to the twentieth aspect, the dummy data transmission circuit sets current consumption during communication to have the same power consumption as that of the data transmission circuit.

An assembled battery system according to the twenty-second aspect is characterized in that, the assembled battery system includes: a voltage measurement apparatus that includes a plurality of voltage detection circuits and a host apparatus; and an assembled battery. The assembled battery system is provided to measure a cell voltage in an assembled battery configured by connecting a plurality of cells in series. The voltage measurement apparatus is configured by connecting the plurality of voltage detection circuits in daisy chain. Each of the voltage detection circuits measures a cell voltage in the assembled battery configured by connecting the plurality of cells in series, and each of the voltage detection circuits includes:

a downstream communication circuit having a function of receiving communication from a host apparatus side and a function of transmitting communication to the host apparatus side;

an upstream communication circuit having a function of transferring the communication from the host apparatus side to other voltage detection circuit and a function of receiving communication from the other voltage detection circuit; and a control circuit that selectively switches over three circuits which are a data transmission circuit, a dummy current circuit, and a transfer circuit for data received from the upstream communication circuit based on the communication received by the downstream communication circuit from the host apparatus side, and controls the downstream communication circuit and the upstream communication circuit.

An assembled battery system according to the twenty-third aspect is characterized in that, in the assembled battery system according to the twenty-second aspect, the control circuit selects the data transmission circuit when the communication received from the host apparatus side is directed to the self-voltage detection circuit, the control circuit turns on the dummy current circuit when the communication received from the host apparatus side is directed to a voltage detection circuit closer to the host apparatus side than the self-voltage detection circuit, and the control circuit selects the transfer circuit for data received from the upstream communication circuit when the communication received from the host apparatus side is directed to a voltage detection circuit more distant from the host apparatus side than the self-voltage detection circuit.

An assembled battery system according to the twenty-fourth aspect is characterized in that, in the assembled battery system according to the twenty-second or twenty-third aspect, the dummy current circuit sets a current value to have the same power consumption as that of the data transmission circuit.

DESCRIPTION OF NUMERICAL REFERENCES 1, 2, 3, 1A, 2A, 3A, 1B, 2B, 3B, 1C, 2C, 3C, 4A, 4B: VOLTAGE DETECTION CIRCUIT
10, 20, 30, 10A, 20A, 30A, 10B, 20B, 30B, 10C, 20C, 30C: CONTROL CIRCUIT
11, 21, 31: DOWNSTREAM COMMUNICATION CIRCUIT
12, 22, 32: UPSTREAM COMMUNICATION CIRCUIT
13, 23, 33: DATA TRANSMISSION CIRCUIT
13P, 23P, 33P: REPLY SIGNAL GENERATION CIRCUIT
14, 24, 34: DATA TRANSFER CIRCUIT
14P, 24P, 34P: UPSTREAM TRANSFER CIRCUIT
15, 25, 35: DUMMY DATA TRANSMISSION CIRCUIT
15P, 25P, 35P: DUMMY REPLY SIGNAL GENERATION CIRCUIT
16, 26, 36: DUMMY CURRENT CIRCUIT
16P, 26P, 36P: DUMMY CURRENT GENERATION CIRCUIT
17, 27, 37: BATTERY DATA ACQUISITION CIRCUIT
18, 28, 38: DOWNSTREAM TRANSFER CIRCUIT
50, 100, 100A: HOST APPARATUS
101, 102, 103: VOLTAGE DETECTION CIRCUIT
200, 200A, 200B, 200C: ASSEMBLED BATTERY SYSTEM
210, 210A, 210B, 210C: VOLTAGE MEASUREMENT APPARATUS
B1, B2, B3: BATTERY CELL (CELL)
BA: ASSEMBLED BATTERY
C1, C2: CAPACITOR
TR1, TR2: TRANSFORMER

The invention claimed is:
1. A voltage detection circuit for measuring each cell voltage of an assembled battery configured by connecting a plurality of cells in series,
wherein the voltage detection circuit is defined as a first voltage detection circuit, wherein the voltage detection circuit comprises:
a reply signal generation circuit that generates a reply signal containing data detected by the first voltage detection circuit;
an upstream transfer circuit that transfers a signal received by an upstream communication circuit to downstream;
a dummy current consumption circuit that consumes a predetermined dummy current; and
a control circuit that controls the reply signal generation circuit, the upstream transfer circuit, and the dummy current consumption circuit to selectively operate any one of the reply signal generation circuit, the upstream transfer circuit, and the dummy current consumption circuit, based on a communication command signal,
wherein the dummy current consumption circuit is a dummy reply signal generation circuit that consumes an identical power to a power consumed in transmission of the reply signal by the reply signal generation circuit, to generate a dummy reply signal, and
wherein the dummy reply signal generation circuit transmits the dummy reply signal at a communication speed higher than a communication speed of the reply signal generation circuit.

2. The voltage detection circuit as claimed in claim 1, wherein the upstream communication circuit communicates with a third voltage detection circuit provided upstream of the first voltage detection circuit.

3. The voltage detection circuit as claimed in claim 1, further comprising:
a downstream communication circuit that communicates with a host apparatus to communicate with a plurality of voltage detection circuits connected in series with each other, or communicates with the host apparatus via a second voltage detection circuit provided downstream of the first voltage detection circuit.

4. The voltage detection circuit as claimed in claim 3, wherein the communication command signal is received from the host apparatus.

5. The voltage detection circuit as claimed in claim 1, wherein the control circuit is configured to control the reply signal generation circuit, the upstream transfer circuit, and the dummy current consumption circuit to select and operate the reply signal generation circuit when the communication command signal indicates request for the data detected by the first voltage detection circuit.

6. The voltage detection circuit as claimed in claim 2, wherein the control circuit is configured to control the reply signal generation circuit, the upstream transfer circuit, and the dummy current consumption circuit to select and operate the upstream transfer circuit when the communication command signal indicates request for the data detected by the third voltage detection circuit.

7. The voltage detection circuit as claimed in claim 3, wherein the control circuit is configured to control the reply signal generation circuit, the upstream transfer circuit, and the dummy current consumption circuit to select and operate the dummy current consumption circuit when the communication command signal indicates request for the data detected by the second voltage detection circuit.

8. The voltage detection circuit as claimed in claim 1, wherein the dummy current consumption circuit is a dummy current generation circuit that consumes an identical power to a power consumed in transmission of the reply signal by the reply signal generation circuit, to generate a dummy current.

9. The voltage detection circuit as claimed in claim 1, wherein the power consumption of the upstream transfer circuit, the power consumption of the reply signal generation circuit, and the power consumption of the dummy current consumption circuit are same to each other.

10. The voltage detection circuit as claimed in claim 1, wherein the upstream communication circuit of the voltage detection circuit that detects the cell voltage of the most upstream cell selected from the plurality of cells does not receive the dummy reply signal from the voltage detection circuit located at the side of upstream.

11. The voltage detection circuit as claimed in claim 1, wherein the data includes a battery data of a cell voltage detected by the first voltage detection circuit.

12. A voltage measurement apparatus comprising:
a plurality of voltage detection circuits; and
a host apparatus that communicates with the plurality of voltage detection circuits,
wherein the voltage measurement apparatus is configured to measure a plurality of cell voltages of an assembled battery configured by connecting a plurality of cells in series,
wherein one voltage detection circuit selected from the plurality of voltage detection circuits is defined as a first voltage detection circuit, and
wherein each of the voltage detection circuits comprises:
a downstream communication circuit that communicates with a host apparatus to communicate with a plurality of voltage detection circuits connected in series with each other, or communicates with the host apparatus via a second voltage detection circuit provided downstream of the first voltage detection circuit;
an upstream communication circuit that communicates with a third voltage detection circuit provided upstream of the first voltage detection circuit;
a reply signal generation circuit that generates a reply signal containing data detected by each of the voltage detection circuits;
an upstream transfer circuit that transfers a signal received by the upstream communication circuit to downstream;
a dummy current consumption circuit that consumes a predetermined dummy current; and
a control circuit that controls the reply signal generation circuit, the upstream transfer circuit, and the dummy current consumption circuit to selectively operate any one of the reply signal generation circuit, the upstream transfer circuit, and the dummy current consumption circuit, based on a communication command signal received from the host apparatus,
wherein the dummy current consumption circuit is a dummy reply signal generation circuit that consumes an identical power to a power consumed in transmission of the reply signal by the reply signal generation circuit, to generate a dummy reply signal, and
wherein the dummy reply signal generation circuit transmits the dummy reply signal at a communication speed higher than a communication speed of the reply signal generation circuit.

13. The voltage measurement apparatus as claimed in claim 12,
wherein the data includes a battery data of a cell voltage detected by each of the voltage detection circuits.

14. An assembled battery system comprising:
a plurality of voltage detection circuits;
a host apparatus; and
an assembled battery configured by connecting a plurality of cells in series,
wherein the assembled battery system is configured to measure a plurality of cell voltages of the assembled battery,
wherein one voltage detection circuit selected from the plurality of voltage detection circuits is defined as a first voltage detection circuit, and
wherein each of the voltage detection circuit comprises:
a downstream communication circuit that communicates with a host apparatus to communicate with a plurality of voltage detection circuits connected in series with each other, or communicates with the host apparatus via a second voltage detection circuit provided downstream of the first voltage detection circuit;
an upstream communication circuit that communicates with a third voltage detection circuit provided upstream of the first voltage detection circuit;
a reply signal generation circuit that generates a reply signal containing data detected by each of the voltage detection circuits;
an upstream transfer circuit that transfers a signal received by the upstream communication circuit to downstream;
a dummy current consumption circuit that consumes a predetermined dummy current; and
a control circuit that controls the reply signal generation circuit, the upstream transfer circuit, and the dummy current consumption circuit to selectively operate any one of the reply signal generation circuit, the upstream transfer circuit, and the dummy current consumption circuit, based on a communication command signal received from the host apparatus,
wherein the dummy current consumption circuit is a dummy reply signal generation circuit that consumes an identical power to a power consumed in transmission of the reply signal by the reply signal generation circuit, to generate a dummy reply signal, and
wherein the dummy reply signal generation circuit transmits the dummy reply signal at a communication speed higher than a communication speed of the reply signal generation circuit.

15. The assembled battery system as claimed in claim 14, wherein the data includes a battery data of a cell voltage detected by each of the voltage detection circuits.

* * * * *